United States Patent
Harashima et al.

(10) Patent No.: US 11,482,514 B2
(45) Date of Patent: Oct. 25, 2022

(54) SEMICONDUCTOR STORAGE DEVICE INCLUDING FIRST PADS ON A FIRST CHIP THAT ARE BONDED TO SECOND PADS ON A SECOND CHIP

(71) Applicant: KIOXIA CORPORATION, Tokyo (JP)

(72) Inventors: Hiromitsu Harashima, Yokohama Kanagawa (JP); Yasushi Kameda, Hayama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 210 days.

(21) Appl. No.: 16/803,485

(22) Filed: Feb. 27, 2020

(65) Prior Publication Data

US 2021/0082896 A1   Mar. 18, 2021

(30) Foreign Application Priority Data

Sep. 13, 2019   (JP) .............................. JP2019-166972

(51) Int. Cl.
*H01L 23/00*   (2006.01)
*H01L 25/00*   (2006.01)
(Continued)

(52) U.S. Cl.
CPC .............. *H01L 25/18* (2013.01); *H01L 22/20* (2013.01); *H01L 23/481* (2013.01); *H01L 24/05* (2013.01);
(Continued)

(58) Field of Classification Search
CPC ....... H01L 25/18; H01L 22/20; H01L 23/481; H01L 24/05; H01L 24/08; H01L 24/89;
(Continued)

(56) References Cited

U.S. PATENT DOCUMENTS

| 8,159,254 B2 | 4/2012 | Kaltalioglu |
| 10,354,987 B1 * | 7/2019 | Mushiga ........... H01L 21/76898 |

(Continued)

FOREIGN PATENT DOCUMENTS

| JP | 2002093812 A | 3/2002 |
| JP | 2007005662 A | 1/2007 |

(Continued)

*Primary Examiner* — Kyoung Lee
(74) *Attorney, Agent, or Firm* — Kim & Stewart LLP

(57) ABSTRACT

A semiconductor storage device includes first and second chips. The first chip includes memory cells provided on a first substrate in a memory cell region, a plurality of first pads provided on a first surface of the first substrate and disposed in an edge region of the first chip that surrounds the memory cell region, and a first conductive layer provided on the first substrate and electrically connected to the first pads. The second chip includes a first circuit provided on a second substrate in a circuit region, a plurality of second pads provided on the second substrate and disposed in an edge region of the second chip that surrounds the circuit region, and a second conductive layer provided on the second substrate and electrically connected to the second pads. The first pads of the first chip and the second pads of the second chip are bonded facing each other.

20 Claims, 32 Drawing Sheets

(51) Int. Cl.
  *H01L 25/18* (2006.01)
  *H01L 23/48* (2006.01)
  *H01L 27/11526* (2017.01)
  *H01L 21/66* (2006.01)
  *H01L 27/11582* (2017.01)
  *H01L 27/11573* (2017.01)
  *H01L 27/11556* (2017.01)

(52) U.S. Cl.
  CPC .............. *H01L 24/08* (2013.01); *H01L 24/89* (2013.01); *H01L 25/50* (2013.01); *H01L 27/11526* (2013.01); *H01L 27/11556* (2013.01); *H01L 27/11573* (2013.01); *H01L 27/11582* (2013.01); *H01L 2224/0557* (2013.01); *H01L 2224/08145* (2013.01); *H01L 2224/80121* (2013.01); *H01L 2224/80895* (2013.01); *H01L 2224/80896* (2013.01); *H01L 2224/80908* (2013.01); *H01L 2924/14511* (2013.01)

(58) Field of Classification Search
  CPC ............... H01L 25/50; H01L 27/11526; H01L 27/11556; H01L 27/11573; H01L 27/11582; H01L 2224/0557; H01L 2224/08145; H01L 2224/80121
  See application file for complete search history.

(56) References Cited

U.S. PATENT DOCUMENTS

| | | |
|---|---|---|
| 2012/0080806 A1 | 4/2012 | Song et al. |
| 2015/0287706 A1* | 10/2015 | Sukekawa ............. H01L 23/642 257/390 |
| 2018/0138098 A1 | 5/2018 | Schneider et al. |
| 2021/0036006 A1* | 2/2021 | Chen ................. H01L 21/76877 |

FOREIGN PATENT DOCUMENTS

| | | |
|---|---|---|
| JP | 2007165392 A | 6/2007 |
| JP | 2011023516 A | 2/2011 |

* cited by examiner

SEMICONDUCTOR STORAGE DEVICE INCLUDING FIRST PADS ON A FIRST CHIP THAT ARE BONDED TO SECOND PADS ON A SECOND CHIP

CROSS-REFERENCE TO RELATED APPLICATION(S)

This application is based upon and claims the benefit of priority from Japanese Patent Application No. 2019-166972, filed on Sep. 13, 2019, the entire contents of which are incorporated herein by reference.

FIELD

Embodiments described herein relate generally to a semiconductor storage device.

BACKGROUND

A semiconductor storage device in which memory cells are three-dimensionally arranged is known.

DETAILED DESCRIPTION

Figure 1A:
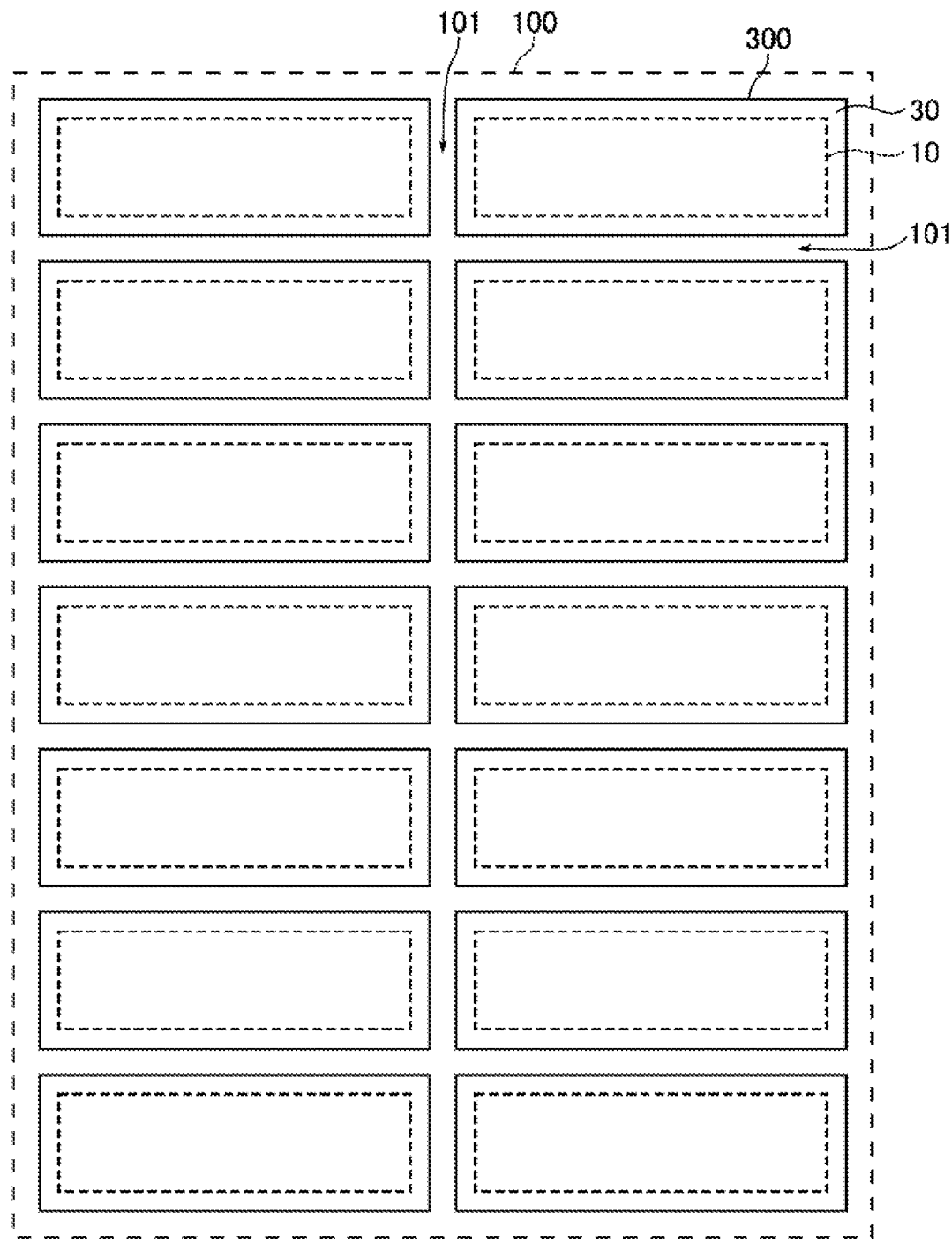
FIG. 1A is a plan view of an area on a wafer including memory array chips of a first embodiment.

Embodiments provide a semiconductor storage device capable of improving operation reliability.

In general, according to one embodiment, a semiconductor storage device includes first and second chips. The first chip includes a plurality of memory cells provided on a first substrate in a memory cell region, a plurality of first pads provided on a first surface of the first substrate and disposed in an edge region of the first chip that surrounds the memory cell region, and a first conductive layer provided on the first substrate and electrically connected to the first pads. The second chip includes a first circuit provided on a second substrate in a circuit region, a plurality of second pads provided on the second substrate and disposed in an edge region of the second chip that surrounds the circuit region, and a second conductive layer provided on the second substrate and electrically connected to the second pads. The first pads of the first chip and the second pads of the second chip are bonded facing each other.

Hereinafter, embodiments will be described with reference to the drawings. In the following description, elements having the same functions and configurations are denoted by same reference numerals. Each embodiment described below is an example of an apparatus or a method for embodying the technical idea of the embodiment, but the materials, the shapes, the structures, the arrangements, etc. of components are not limited to the ones described.

Here, as a semiconductor storage device, a three-dimensionally stacked NAND-type flash memory in which memory cell transistors are stacked above a semiconductor substrate will be described as an example. In this specification, a memory cell transistor may be referred to as a memory cell.

1. First Embodiment

Hereinafter, a semiconductor storage device of a first embodiment will be described.

1.1 Configuration of First Embodiment

Hereinafter, a layout configuration, a circuit configuration, and a cross-sectional structure of the semiconductor storage device of the first embodiment will be sequentially described.

1.1.1 Layout Configuration of Semiconductor Storage Device

Figure 1B:
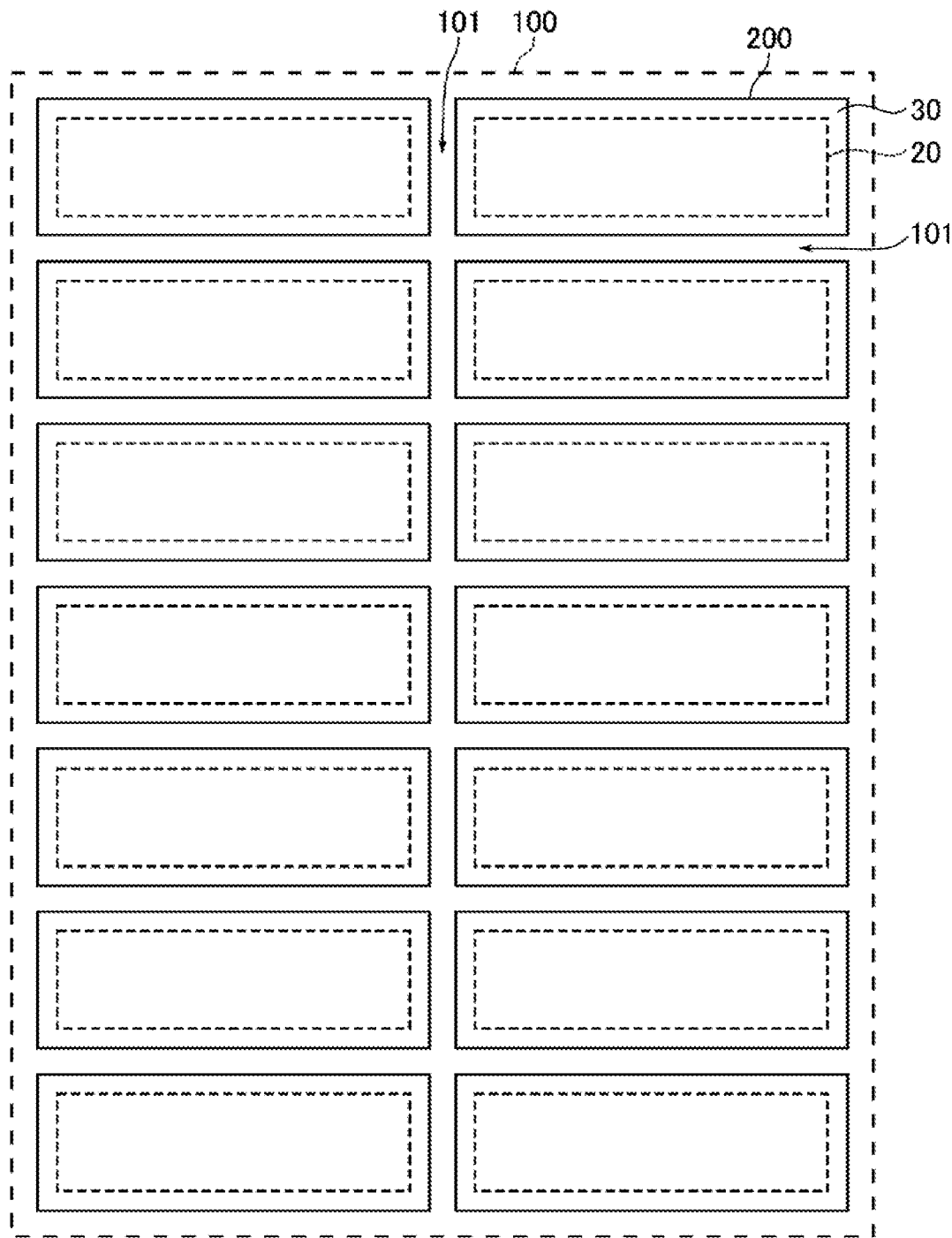
FIG. 1B is a plan view of an area on a wafer including peripheral circuit chips of the first embodiment.

FIG. 1A is a plan view of an area on a wafer including memory array chips 300 corresponding to one reticle (or a photomask), and FIG. 1B is a plan view of an area on a wafer including peripheral circuit chips 200 corresponding to one reticle (or a photomask). In the following drawings including FIG. 1A and FIG. 1B, two directions parallel to a wafer surface or a semiconductor substrate surface and perpendicular to each other are referred to as an X direction and a Y direction, and a direction perpendicular to the XY plane including the X direction and the Y direction is referred to as a Z direction.

As illustrated in FIG. 1A, the plurality of memory array chips 300 is arranged in a matrix form in the X direction and the Y direction, for example, in an area on the wafer corresponding to one reticle 100. Likewise, as illustrated in FIG. 1B, the plurality of peripheral circuit chips 200 is arranged in a matrix form in the X direction and the Y direction, for example, in an area on the wafer corresponding to one reticle 100. The semiconductor storage device of the embodiment includes a structure in which the peripheral circuit chip 200 and the memory array chip 300 are arranged top to bottom in the Z direction with bonding between them. The peripheral circuit chip 200 and the memory array chip 300 will be described in detail below.

In the semiconductor storage devices in which the peripheral circuit chips 200 and the memory array chips 300 are arranged in a matrix form, a dicing line 101 is provided between adjacent semiconductor storage devices. During the manufacturing process, the plurality of semiconductor storage devices is cut by the dicing line 101, and separated into individual semiconductor storage devices 1 illustrated in FIG. 2.

Figure 2:
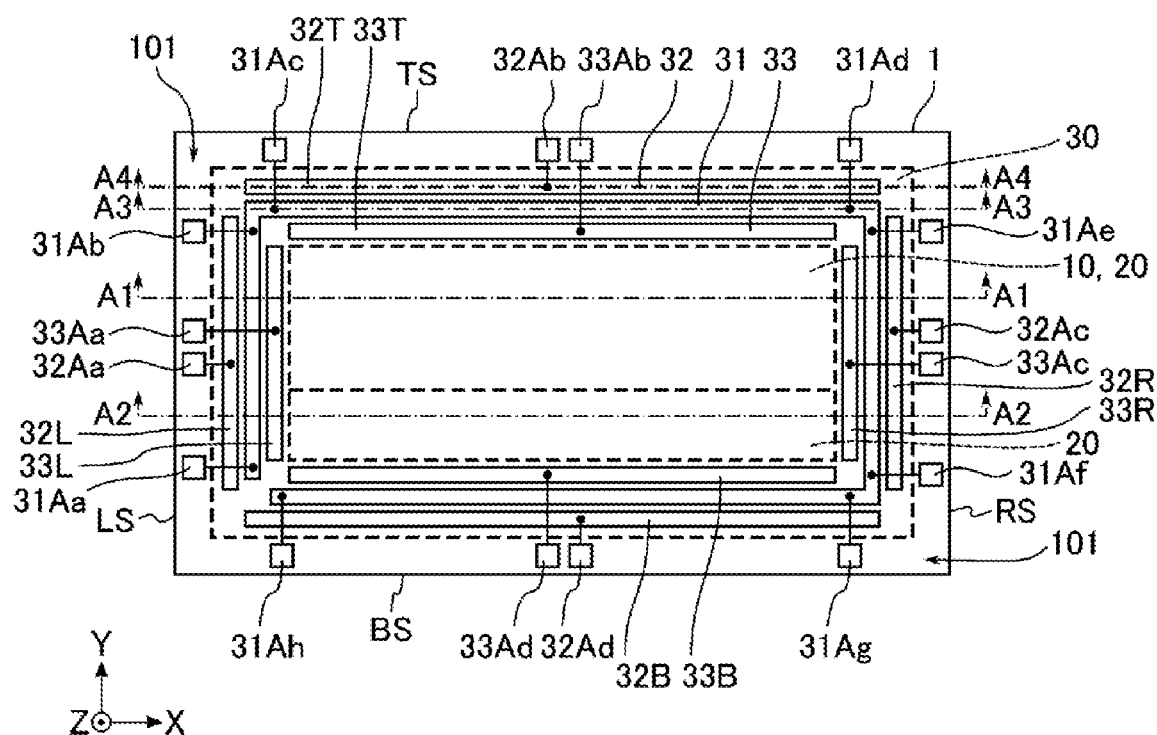
FIG. 2 is a plan view illustrating patterns provided in an end region and a dicing line in a semiconductor storage device of the first embodiment.

FIG. 2 is a plan view illustrating a configuration of the semiconductor storage device 1 of the first embodiment. A configuration of the semiconductor storage device 1 will be described by using FIG. 1A, FIG. 1B, and FIG. 2.

Each semiconductor storage device 1 includes a memory cell region 10, and a peripheral circuit region 20. More specifically, each semiconductor storage device 1 is formed by bonding the memory array chip 300 including the memory cell region 10 to the peripheral circuit chip 200 including the peripheral circuit region 20. Each of the memory array chip 300 and the peripheral circuit chip 200 has, for example, a rectangular shape. The semiconductor storage device 1 formed by bonding the memory array chip 300 and the peripheral circuit chip 200 also has, for example, a rectangular shape. As illustrated in FIG. 1A, in the memory array chip 300, the memory cell region 10 is arranged in the Y direction at or near the center of the rectangular shape and the periphery thereof is surrounded by an end region 30. As illustrated in FIG. 1B, in the peripheral circuit chip 200, the peripheral circuit region 20 is arranged in the Y direction at or near the center of the rectangular shape, and the periphery thereof is surrounded by the end region 30. The memory cell region 10 is a region where a plurality of memory cells is arranged. The peripheral circuit region 20 is a region where peripheral circuits controlling operations of the plurality of memory cells are provided. The end region 30 is a region arranged to surround the memory cell region 10 or the peripheral circuit region 20. The end region 30 is provided in the vicinity of an end portion or near the end portion, of the memory array chip 300 or the peripheral circuit chip 200.

Next, descriptions will be made on the layouts of the memory cell region 10, the peripheral circuit region 20, and the end region 30, and the patterns provided in the end region 30, in the semiconductor storage device 1 of the first embodiment, by using FIG. 2.

FIG. 2 illustrates the arrangement of a conductive layer, a conductive pad and a via when viewed in the Z direction, in one rectangular pattern, and illustrates a state viewed through interlayer insulating layers between the conductive layers, and between the conductive layer and the conductive pad. In FIG. 2, left, right, top, and bottom sides of the rectangular shape of the semiconductor storage device 1 will be referred to as a left side LS, a right side RS, a top side TS, and a bottom side BS, respectively. Here, the dicing line 101 is illustrated in the outer periphery of the semiconductor storage device 1, but, in certain cases, the dicing line 101 may be removed during dicing. In the following description, "left," "right," "upper," and "lower" correspond to directions in the XY plane.

A chain wiring 31, and adjacent wirings 32 and 33 are provided in the end region 30. The adjacent wirings 32 and 33 are provided adjacent to the chain wiring 31. The chain wiring 31 is disposed between the adjacent wirings 32 and 33. Each of the chain wiring 31 and the adjacent wirings 32 and 33 schematically illustrates a conductive layer, a conductive pad, and a via in one rectangular pattern.

The chain wiring 31 continuously surrounds the memory cell region 10 and the peripheral circuit region 20. The chain wiring 31 includes a first portion extending in the Y direction along the left side LS, a second portion extending in the X direction along the top side TS, a third portion extending in the Y direction along the right side RS, and a fourth portion extending in the X direction along the bottom side BS. The chain wiring 31 is cut at, for example, one certain point. In the example illustrated in FIG. 2, a part of the chain wiring 31 is cut at the left lower portion of the semiconductor storage device 1, that is, in the vicinity of an area where the left side LS and the bottom side BS intersect.

The adjacent wiring 32 includes adjacent wirings 32L, 32T, 32R, and 32B arranged in the vicinity of the left side LS, the top side TS, the right side RS, and the bottom side BS of the semiconductor storage device 1, respectively. The adjacent wirings 32L, 32T, 32R, and 32B will be referred to as the adjacent wiring 32 when not distinguished from each other. The adjacent wiring 32 indicates each of the adjacent wirings 32L, 32T, 32R, and 32B.

The adjacent wirings 32L, 32T, 32R, and 32B are arranged closer to outer periphery sides of the semiconductor storage device 1, respectively, than the chain wiring 31. The adjacent wiring 32L is disposed at a position corresponding to the left side LS, and extends in the Y direction along the left side LS. The adjacent wiring 32T is disposed at a position corresponding to the top side TS, and extends in the X direction along the top side TS. The adjacent wiring 32R is disposed at a position corresponding to the right side RS, and extends in the Y direction along the right side RS. The adjacent wiring 32B is disposed at a position corresponding to the bottom side BS, and extends in the X direction along the bottom side BS.

The adjacent wiring 33 includes adjacent wirings 33L, 33T, 33R, and 33B arranged in the vicinity of the left side LS, the top side TS, the right side RS, and the bottom side BS of the semiconductor storage device 1, respectively. Similarly to the adjacent wiring 32, the adjacent wirings 33L, 33T, 33R, and 33B will be referred to as the adjacent wiring 33 when not distinguished from each other. The adjacent wiring 33 indicates each of the adjacent wirings 33L, 33T, 33R, and 33B.

The adjacent wiring 33 is disposed closer to the center of the semiconductor storage device 1, than the chain wiring 31. The adjacent wiring 33L is disposed at a position corresponding to the left side LS, and extends in the Y direction along the left side LS. The adjacent wiring 33T is disposed at a position corresponding to the top side TS, and extends in the X direction along the top side TS. The adjacent wiring 33R is disposed at a position corresponding to the right side RS, and extends in the Y direction along the right side RS. The adjacent wiring 33B is disposed at a position corresponding to the bottom side BS, and extends in the X direction along the bottom side BS.

At the outer periphery of the end region 30, the dicing line 101 surrounds the end region 30. Conductive pads 31A, 32A, and 33A are provided on the dicing line 101. The conductive pad 31A includes conductive pads 31Aa, 31Ab, 31Ac, 31Ad, 31Ae, 31Af, 31Ag, and 31Ah. The conductive pads 31Aa to 31Ah will be referred to as the conductive pad 31A when not distinguished from each other. The conductive pad 31A indicates each of the conductive pads 31Aa to 31Ah.

The conductive pad 32A includes conductive pads 32Aa, 32Ab, 32Ac, and 32Ad. The conductive pads 32Aa to 32Ad will be referred to as the conductive pad 32A when not distinguished from each other. The conductive pad 32A indicates each of the conductive pads 32Aa to 32Ad.

The conductive pad 33A includes conductive pads 33Aa, 33Ab, 33Ac, and 33Ad. The conductive pads 33Aa to 33Ad will be referred to as the conductive pad 33A when not distinguished from each other. The conductive pad 33A indicates each of the conductive pads 33Aa to 33Ad.

The conductive pad 31A is electrically connected to the chain wiring 31 provided in the end region 30 without interposition of a conductive layer and a via (not illustrated). Likewise, each of the conductive pads 32A and 33A is electrically connected to each of the adjacent wirings 32 and 33 provided in the end region 30 without interposition of a via and a conductive layer.

As described above, the chain wiring 31 includes the first portion corresponding to the left side LS, the second portion corresponding to the top side TS, the third portion corresponding to the right side RS, and the fourth portion corresponding to the bottom side BS.

The conductive pad 31Aa is electrically connected to one end of the first portion of the chain wiring 31, and the conductive pad 31Ab is electrically connected to the other end of the first portion. The conductive pad 31Ac electrically connected to one end of the second portion of the chain wiring 31, and the conductive pad 31Ad is electrically connected to the other end of the second portion. The conductive pad 31Ae is electrically connected to one end of the third portion of the chain wiring 31, and the conductive pad 31Af is electrically connected to the other end of the third portion. The conductive pad 31Ag is electrically connected to one end of the fourth portion of the chain wiring 31, and the conductive pad 31Ah is electrically connected to the other end of the fourth portion.

The conductive pad 32Aa is electrically connected to the adjacent wiring 32L. The conductive pad 32Ab is electrically connected to the adjacent wiring 32T. The conductive pad 32Ac is electrically connected to the adjacent wiring 32R. The conductive pad 32Ad is electrically connected to the adjacent wiring 32B.

The conductive pad 33Aa is electrically connected to the adjacent wiring 33L. The conductive pad 33Ab is electrically connected to the adjacent wiring 33T. The conductive pad 33Ac electrically connected to the adjacent wiring 33R. The conductive pad 33Ad is electrically connected to the adjacent wiring 33B.

1.1.2 Circuit Configuration of Semiconductor Storage Device

Next, a circuit configuration of the memory cell region 10 and the peripheral circuit region 20 in the semiconductor storage device 1 of the first embodiment will be described by using FIG. 3 to FIG. 5.

Figure 3:
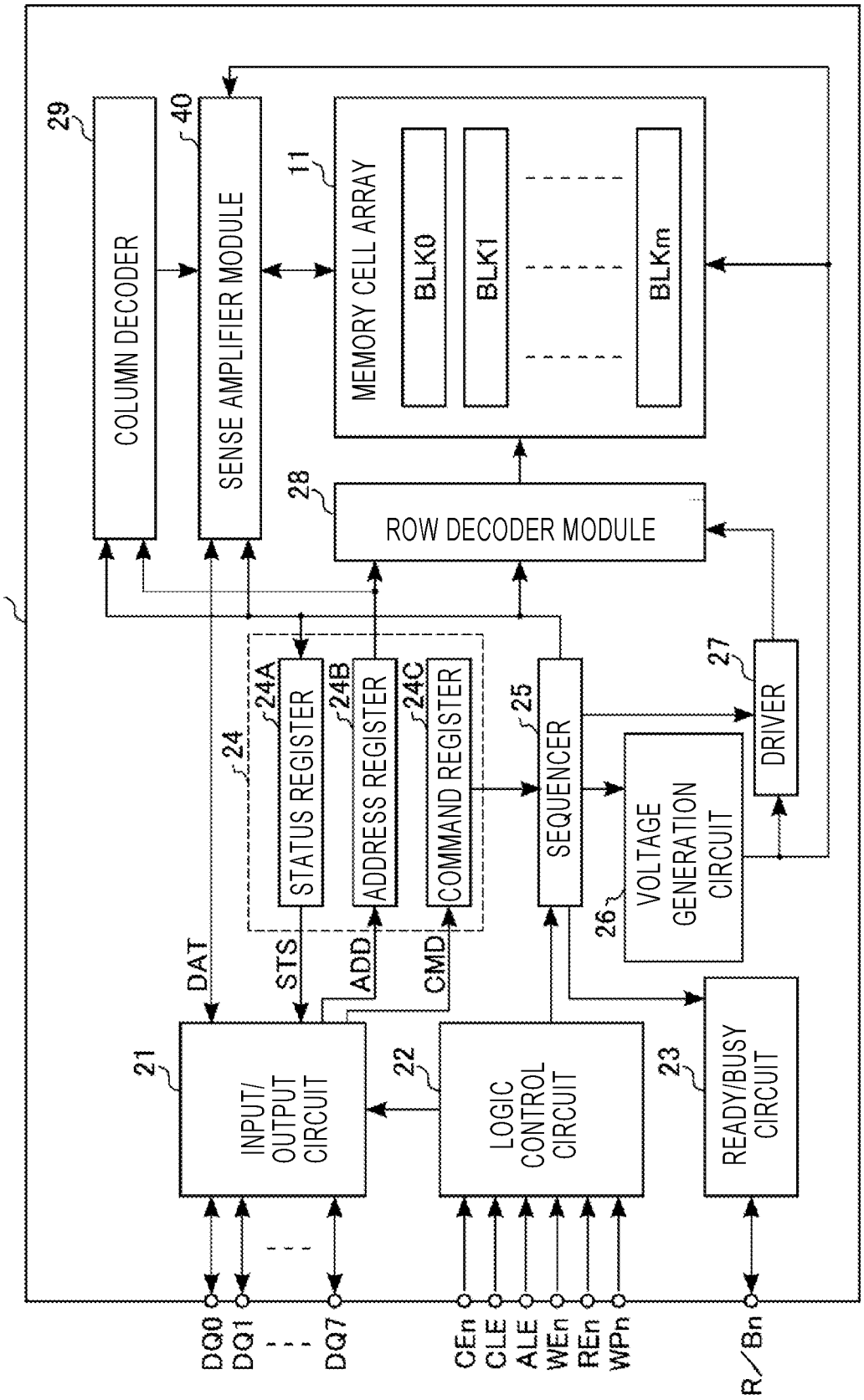
FIG. 3 is a block diagram illustrating a circuit configuration of a memory cell region and a peripheral circuit region in the semiconductor storage device.

FIG. 3 is a block diagram illustrating a circuit configuration of the memory cell region 10 and the peripheral circuit region 20 in the semiconductor storage device of the first embodiment. The semiconductor storage device 1 includes a memory cell array 11, an input/output circuit 21, a logic control circuit 22, a ready/busy circuit 23, a register group 24, a sequencer (or a control circuit) 25, a voltage generation circuit 26, a driver 27, a row decoder module 28, a column decoder 29, and a sense amplifier module 40. The register group 24 includes a status register 24A, an address register 24B, and a command register 24C.

In the memory cell region 10, the memory cell array 11 is mainly disposed. In the peripheral circuit region 20, the input/output circuit 21, the logic control circuit 22, the ready/busy circuit 23, the register group 24, the sequencer (or the control circuit) 25, the voltage generation circuit 26, the driver 27, the row decoder module 28, the column decoder 29, and the sense amplifier module 40 are mainly disposed.

The memory cell array 11 includes one or a plurality of blocks BLK0, BLK1, BLK2, . . . , BLKm (m is an integer greater than or equal to 0). Each of the plurality of blocks BLK includes a plurality of memory cell transistors associated with rows and columns. The memory cell transistor is an electrically rewritable non-volatile memory cell. In the memory cell array 11, a plurality of word lines, a plurality of bit lines, a source line, etc. are provided to control a voltage applied to the memory cell transistor. Hereinafter, a block BLK indicates each of the blocks BLK0 to BLKm. A specific configuration of the block BLK will be described below.

The input/output circuit 21 and the logic control circuit 22 are connected to external devices (e.g., a memory controller) (not illustrated) via a bus. The input/output circuit 21 transmits and receives signals DQ (e.g., DQ0, DQ1, DQ2, . . . , DQ7) to/from the memory controller via the bus.

The logic control circuit 22 receives an external control signal from the memory controller via the bus. The external control signal includes, for example, a chip enable signal CEn, a command latch enable signal CLE, an address latch enable signal ALE, a write enable signal WEn, a read enable signal REn, and a write protect signal WPn, where "n" appended to a signal name indicates that the signal is active when it is low.

The chip enable signal Cen enables selection of the semiconductor storage device (e.g., NAND-type flash memory) 1, and is asserted when the semiconductor storage device 1 is selected. The command latch enable signal CLE makes it possible to latch a command transmitted as the signal DQ by the command register 24C. The address latch enable signal ALE makes it possible to latch an address transmitted as the signal DQ by the address register 24B. The write enable signal WEn makes it possible to store data transmitted as the signal DQ in the input/output circuit 21. The read enable signal REn makes it possible to output data read from the memory cell array 11, as the signal DQ. The write protect signal WPn is asserted when writing and erasing to the semiconductor storage device 1 are prohibited.

The ready/busy circuit 23 generates a ready/busy signal R/Bn according to a control from the sequencer 25. The signal R/Bn indicates whether the semiconductor storage device 1 is placed in a ready state or a busy state. The ready state indicates a state where accepting a command from the memory controller is possible. The busy state indicates a state where a command from the memory controller cannot be accepted. The memory controller may know whether the semiconductor storage device 1 is placed in a ready state or a busy state by receiving the signal R/Bn from the semiconductor storage device 1.

The status register 24A stores status information STS required for operation of the semiconductor storage device 1, and transmits the status information STS to the input/output circuit 21 on the basis of an instruction of the sequencer 25. The address register 24B stores address information ADD transmitted from the input/output circuit 21. The address information ADD includes a column address, and a row address. The row address includes, for example, a block address that designates a block BLK as an operation target, and a page address that designates a word line as an operation target in the designated block. The command register 24C stores a command CMD transmitted from the input/output circuit 21. The command CMD includes, for example, a write command and a read command which instruct the sequencer 25 to perform a write operation and a read operation, respectively. The status register 24A, the address register 24B, and the command register 24C are implemented as, for example, SRAMs.

The sequencer 25 receives a command from the command register 24C, and controls the semiconductor storage device 1 according to a sequence based on the command. The sequencer 25 executes a write operation, a read operation, and an erase operation by controlling the row decoder module 28, the sense amplifier module 40, the voltage generation circuit 26, etc.

Specifically, the sequencer 25 controls the row decoder module 28, the driver 27, and the sense amplifier module 40 on the basis of a write command received from the command register 24C so as to write data to a plurality of memory cell transistors designated by address information ADD. The sequencer 25 controls the row decoder module 28, the driver 27, and the sense amplifier module 40 on the basis of a read command received from the command register 24C so as to read data from a plurality of memory cell transistors designated by address information ADD.

The voltage generation circuit 26 receives a power supply voltage from the outside of the semiconductor storage device 1, and generates a plurality of voltages required for a write operation, a read operation, and an erase operation by using the power supply voltage. The voltage generation circuit 26 supplies the generated voltages to the memory cell array 11, the driver 27, the sense amplifier module 40, etc.

The driver 27 receives a plurality of voltages from the voltage generation circuit 26. Among the plurality of voltages supplied from the voltage generation circuit 26, the driver 27 supplies a plurality of voltages selected according to a read operation, a write operation, and an erase operation, to the row decoder module 28 via a plurality of signal lines.

The row decoder module 28 receives a row address from the address register 24B, and decodes the row address. On the basis of the decoding result of the row address, the row decoder module 28 selects one of the blocks BLK, and further selects a word line in the selected block BLK. The row decoder module 28 transmits a plurality of voltages supplied from the driver 27, to the selected block BLK.

The column decoder 29 receives a column address from the address register 24B, and decodes the column address. The column decoder 29 selects a bit line on the basis of the decoding result of the column address.

The sense amplifier module 40 detects and amplifies data read from a memory cell transistor to a bit line during a read operation of data. Then, the sense amplifier module 40 temporarily stores read data DAT read from the memory cell transistor, and transmits the data to the input/output circuit 21. The sense amplifier module 40 temporarily stores write data DAT transmitted from the input/output circuit 21 during a write operation of data. The sense amplifier module 40 transmits the write data DAT to a bit line.

Next, a circuit configuration of the memory cell array 11 will be described by using FIG. 4. As described above, the memory cell array 11 includes a plurality of blocks BLK0 to BLKm. Here, a circuit configuration of one block BLK will be described, but circuit configurations of other blocks are also the same.

Figure 4:
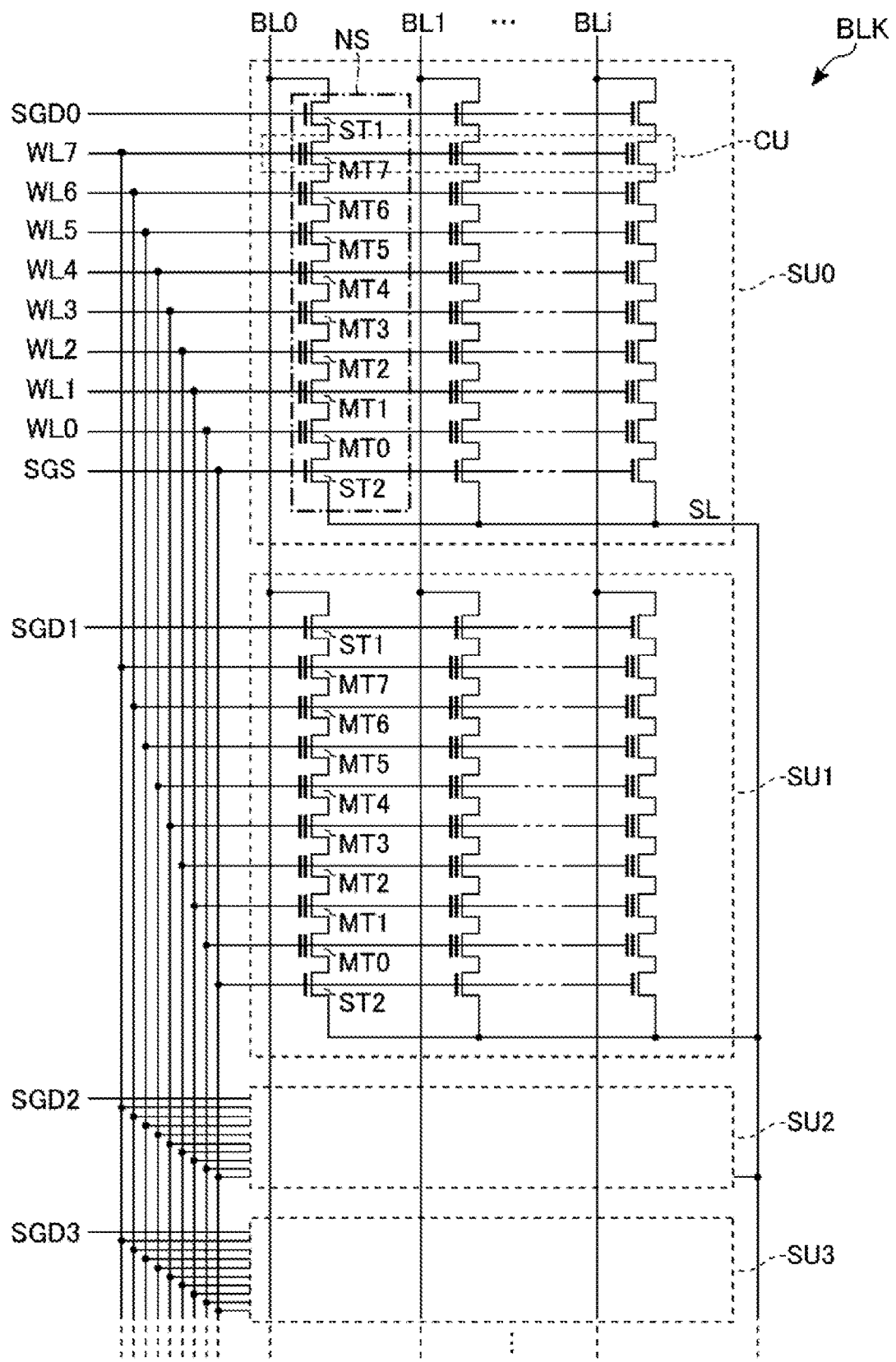
FIG. 4 is a circuit diagram of a block in a memory cell array in the semiconductor storage device.

FIG. 4 is a circuit diagram of one block BLK in the memory cell array 11. The block BLK includes, for example, a plurality of string units SU0, SU1, SU2, and SU3. Here, as an example, an example in which the block BLK includes the string units SU0 to SU3 is illustrated, but the number of string units in the block BLK may be set as desired. Hereinafter, a string unit SU indicates each of the string units SU0 to SU3.

Each of the string units SU0 to SU3 includes a plurality of NAND strings (more generally referred to as memory strings) NS. The number of NAND strings NS in one string unit SU may be set as desired.

The NAND string NS includes a plurality of memory cell transistors MT0, MT1, MT2, . . . , MT7, and select transistors ST1 and ST2. Here, for simplification of explanation, an example in which the NAND string NS includes eight memory cell transistors MT0 to MT7, and two select transistors ST1 and ST2 is illustrated, but the numbers of memory cell transistors and select transistors in the NAND string NS may be set as desired. Hereinafter, a memory cell transistor MT indicates each of the memory cell transistors MT0 to MT7.

Each of the memory cell transistors MT0 to MT7 includes a control gate and a charge storage layer, and stores data in a non-volatile manner. The memory cell transistors MT0 to MT7 are connected in series between a source of the select transistor ST1 and a drain of the select transistor ST2.

The memory cell transistor MT is capable of storing 1-bit data, or data of 2 or more bits. The memory cell transistor MT may be a metal-oxide-nitride-oxide-silicon (MONOS) type transistor using an insulating film as a charge storage layer, or a floating gate (FG) type transistor using a conductive layer as a charge storage layer.

Gates of a plurality of select transistors ST1 in the string unit SU0 are connected to a select gate line SGD0. Similarly, gates of select transistors ST1 of each of the string units SU1 to SU3 are connected to a corresponding one of the select gate lines SGD1 to SGD3. Each of the select gate lines SGD0 to SGD3 is independently controlled by the row decoder module 28.

Gates of a plurality of select transistors ST2 in the string unit SU0 are connected to a select gate line SGS. Similarly, gates of select transistors ST2 of each of the string units SU1 to SU3 are connected to the select gate line SGS. In certain cases, the string units SU0 to SU3 in the block BLK may be connected to individual select gate lines SGS, that is, select gate lines SGS0 to SGS3, respectively. The select transistors ST1 and ST2 are used for selection of the string unit SU in various operations.

Control gates of the memory cell transistors MT0 to MT7 in the block BLK are connected to word lines WL0 to WL7, respectively. Each of the word lines WL0 to WL7 is independently controlled by the row decoder module 28.

Each of bit lines BL0 to BLi (i is an integer greater than or equal to 0) is connected to the plurality of blocks BLK, and is connected to one NAND string NS in the string unit SU in the block BLK. That is, each of the bit lines BL0 to BLi is connected to drains of select transistors ST1 of a plurality of NAND strings NS in the same column, among NAND strings NS arranged in a matrix form in the block BLK. A source line SL is connected to the plurality of blocks BLK. That is, the source line SL is connected to sources of the plurality of select transistors ST2 in the block BLK.

In short, the string unit SU includes the plurality of NAND strings NS connected to different bit lines BL, and connected to the same select gate line SGD. The block BLK includes the plurality of string units SU sharing the word lines WL. The memory cell array 11 includes the plurality of blocks BLK sharing the bit lines BL.

The block BLK is, for example, a data erasing unit. That is, data stored in the memory cell transistors MT in the same block BLK is collectively erased. Alternatively, data may be erased in units of string units SU, or may be erased in units of less than string units SU.

A plurality of memory cell transistors MT sharing the word line WL in one string unit SU is called a cell unit CU. A collection of respective 1-bit data items stored in the plurality of memory cell transistors MT in the cell unit CU is called a page. The storage capacity of the cell unit CU changes according to the number of bits of data stored in the memory cell transistor MT. For example, when each memory cell transistor MT stores 1-bit data, data of 2 bits, and data of 3 bits, the cell unit CU stores one page of data, two pages of data, and three pages of data, respectively.

A write operation and a read operation for the cell unit CU are performed in units of pages. That is, the read and write operations are collectively performed for the plurality of memory cell transistors MT connected to one word line WL disposed in one string unit SU.

As a configuration of the memory cell array 11, other configurations may be employed, e.g., the configurations of the memory cell array described in U.S. patent application Ser. No. 12/407,403 filed on Mar. 19, 2009, entitled "THREE DIMENSIONAL STACKED NONVOLATILE SEMICONDUCTOR MEMORY," in U.S. patent application Ser. No. 12/406,524 filed on Mar. 18, 2009, entitled "THREE DIMENSIONAL STACKED NONVOLATILE SEMICONDUCTOR MEMORY," U.S. patent application Ser. No. 12/679,991 filed on Mar. 25, 2010, entitled "NON-VOLATILE SEMICONDUCTOR STORAGE DEVICE AND METHOD OF MANUFACTURING THE SAME," and U.S. patent application Ser. No. 12/532,030 filed on Mar. 23, 2009, entitled "SEMICONDUCTOR MEMORY AND METHOD FOR MANUFACTURING SAME." These patent applications are incorporated in the present specification by reference in their entireties.

Next, a cross-sectional structure of the NAND string NS in the memory cell array 11 will be described by using FIG. 5. The NAND string NS includes the memory cell transistors MT0 to MT7, and the select transistors ST1 and ST2 as described above.

Figure 5:
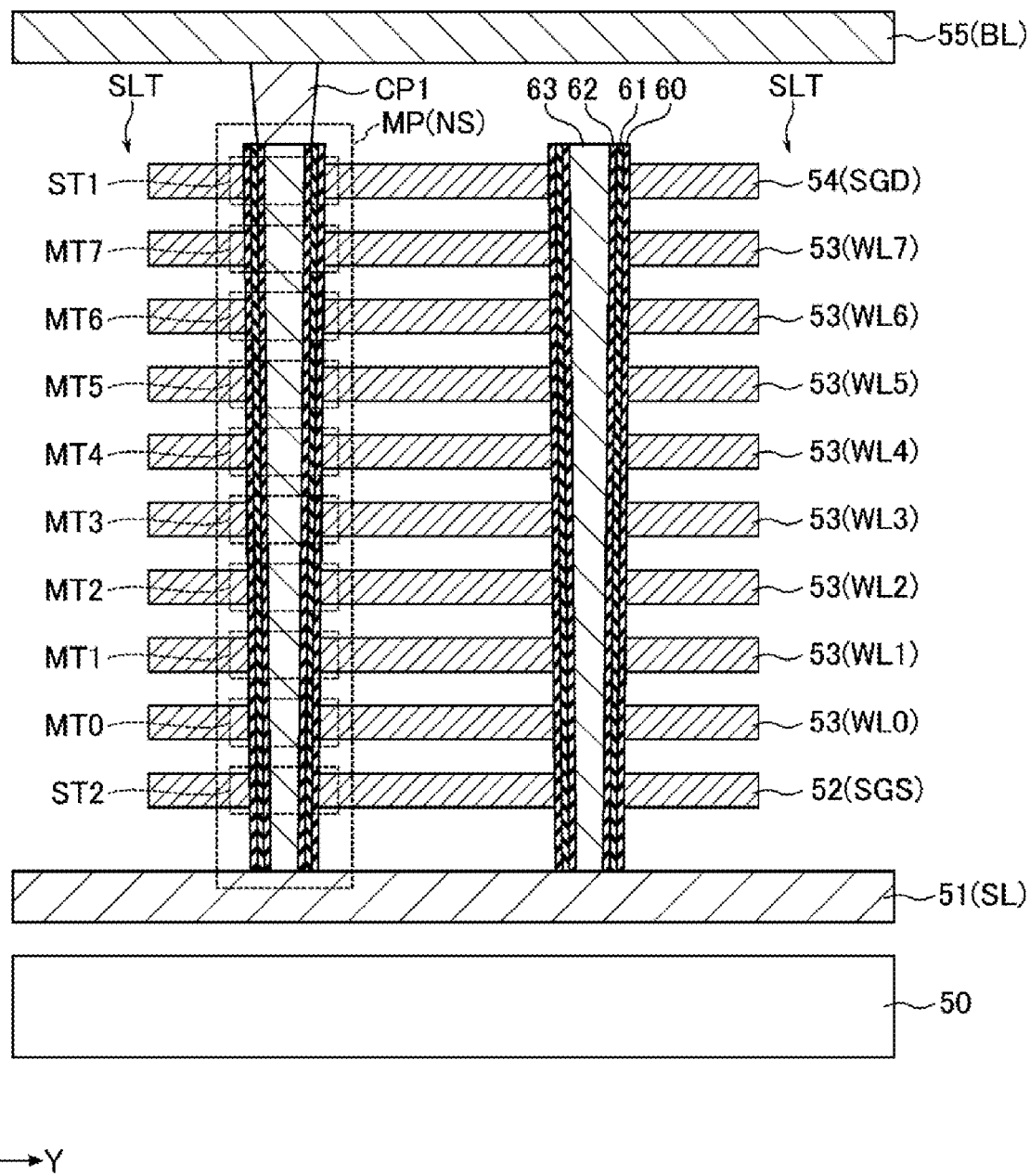
FIG. 5 is a cross-sectional view of a NAND string in the block in the semiconductor storage device.

FIG. 5 is a cross-sectional view of the NAND string NS in the memory cell array 11 in the first embodiment. In FIG. 5, interlayer insulating films between conductive layers are omitted.

As illustrated in FIG. 5, the memory cell array 11 includes a semiconductor substrate 50, conductive layers 51 to 54, memory pillars MP, and a contact plug CP1. The conductive layer 51 is provided above the semiconductor substrate 50. The conductive layer 51 is formed in a plate shape parallel to the XY plane, and functions as the source line SL. The main surface of the semiconductor substrate 50 corresponds to the XY plane.

On the conductive layer 51, a plurality of slits SLT along the XZ plane is arranged in the Y direction. A structure (or a stacked body) on the conductive layer 51 between adjacent slits SLT corresponds to, for example, one string unit SU.

On the conductive layer 51 between the adjacent slits SLT, the conductive layer 52, the plurality of conductive layers 53, the conductive layer 54, and a conductive layer 55 are provided in order from the lower layer. Among these conductive layers, conductive layers adjacent to each other in the Z direction are stacked via the interlayer insulating films. Each of the conductive layers 52 to 54 is formed in a plate shape parallel to the XY plane. The conductive layer 52 functions as the select gate line SGS. The plurality of conductive layers 53 functions as the word lines WL0 to WL7, respectively, in order from the lower layer. The conductive layer 54 functions as the select gate line SGD. The conductive layers 52 to 54 contain, for example, tungsten (W).

The plurality of memory pillars MP is arranged in, for example, staggered patterns in the X direction and the Y direction. Each of the plurality of memory pillars MP extends (or passes) through the inside of the stacked body between the slits SLT, in the Z direction. Each memory pillar MP is provided through the conductive layers 54, 53, and 52 while reaching the upper surface of the conductive layer 51 from the upper surface of the conductive layer 54. Each memory pillar MP functions as one NAND string NS.

The memory pillar MP includes, for example, a block insulating layer 60, a charge storage layer 61, a tunnel insulating layer (also called a tunnel insulating film) 62, and a semiconductor layer 63. Specifically, the block insulating layer 60 is provided on the inner wall of a memory hole for forming the memory pillar MP. The charge storage layer 61 is provided on the inner wall of the block insulating layer 60. The tunnel insulating layer 62 is provided on the inner wall of the charge storage layer 61. The semiconductor layer 63 is provided inside the tunnel insulating layer 62. The memory pillar MP may have a structure in which a core insulating layer is provided inside the semiconductor layer 63.

In such a configuration of the memory pillar MP, a portion where the memory pillar MP and the conductive layer 52 intersect functions as the select transistor ST2. Portions where the memory pillar MP and the conductive layers 53 intersect function as the memory cell transistors MT0 to MT7, respectively. A portion where the memory pillar MP and the conductive layer 54 intersect functions as the select transistor ST1.

The semiconductor layer 63 functions as a channel layer of the memory cell transistors MT, and the select transistors ST1 and ST2. Inside the semiconductor layer 63, a current path of the NAND string NS is formed.

The charge storage layer 61 has a function of storing charges injected from the semiconductor layer 63, in the memory cell transistors MT. The charge storage layer 61 includes, for example, a silicon nitride film.

The tunnel insulating layer 62 functions as a potential barrier when charges are injected from the semiconductor layer 63 to the charge storage layer 61, or when charges stored in the charge storage layer 61 are diffused to the semiconductor layer 63. The tunnel insulating layer 62 includes, for example, a silicon oxide film.

The block insulating layer 60 prevents charges stored in the charge storage layer 61 from being diffused to the conductive layers 53 (the word lines WL). The block insulating layer 60 includes, for example, a silicon oxide layer and a silicon nitride layer.

Above the upper surface of the memory pillar MP, the conductive layer 55 is provided via the interlayer insulating film. The conductive layer 55 is a line-shaped wiring layer extending in the Y direction, and functions as the bit line BL. The plurality of conductive layers 55 is arranged in the X direction, and the conductive layer 55 is electrically connected to one corresponding memory pillar MP in each string unit SU. Specifically, in each string unit SU, the contact plug CP1 is provided on the semiconductor layer 63 in each memory pillar MP, and one conductive layer 55 is provided on the contact plug CP1. The conductive layer 55 contains, for example, aluminum (A1) tungsten (W), or copper (Cu). The contact plug CP1 includes a conductive layer, for example, tungsten (W).

The numbers of word lines WL, and select gate lines SGD and SGS are not limited to the above described numbers, and are changed according to the number of memory cell transistors MT and the number of select transistors ST1 and ST2, respectively. The select gate line SGS may include a plurality of conductive layers provided in a plurality of layers, respectively. The select gate line SGD may include a plurality of conductive layers provided in a plurality of layers, respectively.

1.1.3 Cross-Sectional Structure of Semiconductor Storage Device

Next, a cross-sectional structure of the semiconductor storage device 1 will be described by using FIG. 6 to FIG. 11. In FIG. 6 to FIG. 11, interlayer insulating films between conductive layers are omitted. In the cross-sectional views illustrated in FIG. 6 to FIG. 11, the arrow direction in the Z direction is referred to as a positive direction, and the opposite direction to the arrow direction in the Z direction is referred to as a negative direction.

Figure 6:
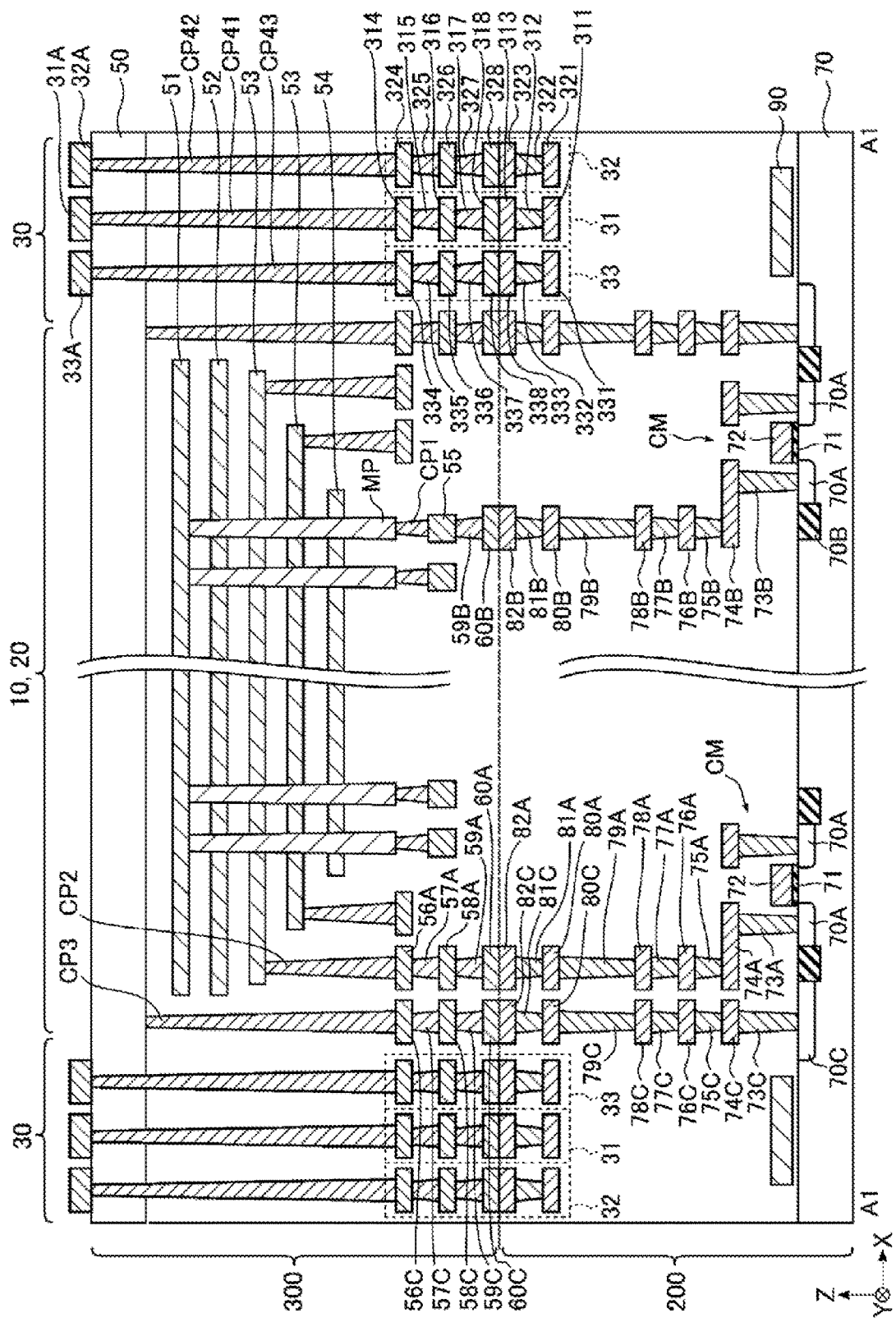
FIG. 6 is a cross-sectional view taken along the A1-A1 line in FIG. 2.
Figure 7:
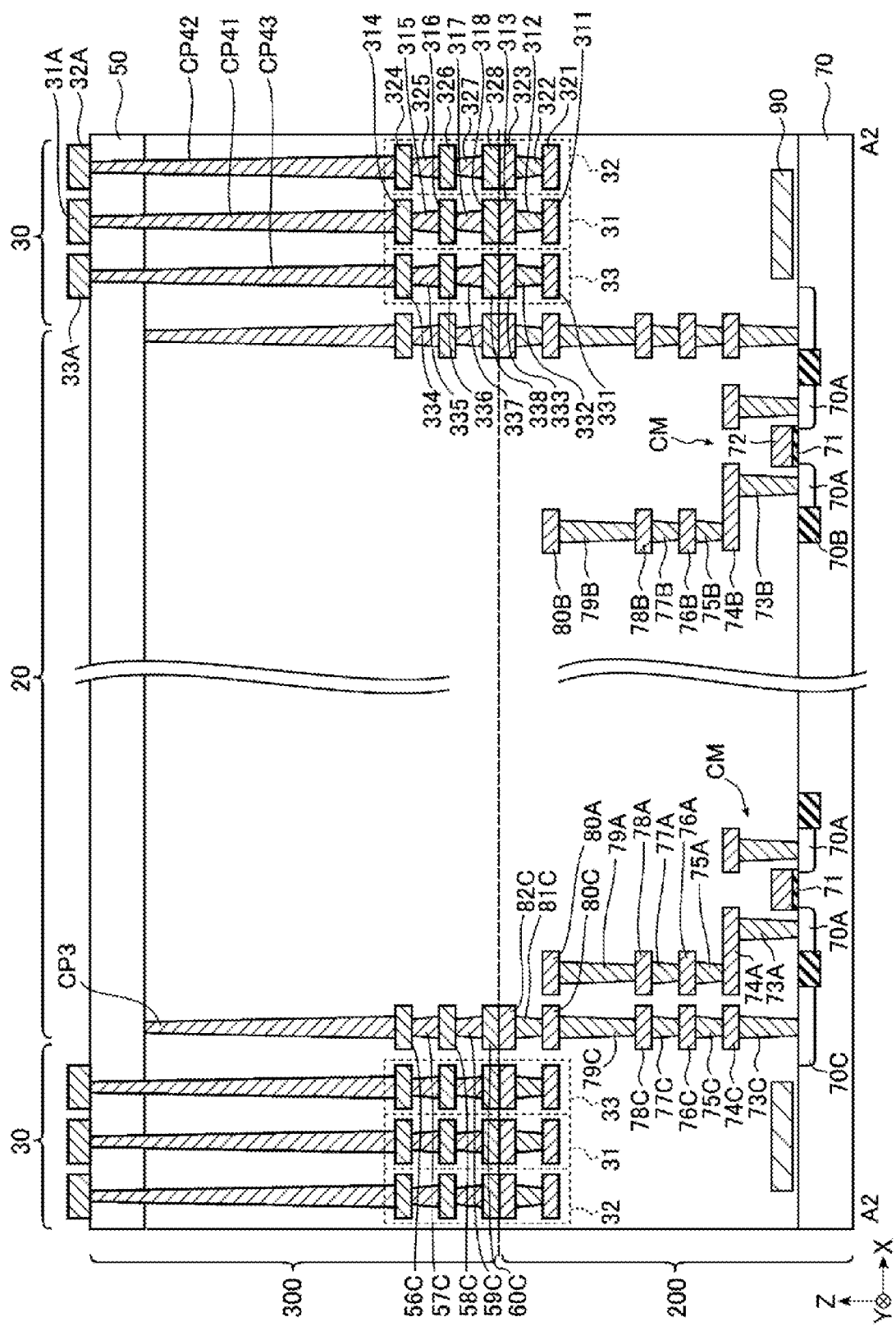
FIG. 7 is a cross-sectional view taken along the A2-A2 line in FIG. 2.

FIG. 6 is a cross-sectional view taken along the A1-A1 line in FIG. 2, and is a cross-sectional view taken along the XZ plane in the memory cell region 10, the peripheral circuit region 20, and the end region 30. FIG. 7 is a cross-sectional view taken along the A2-A2 line at a different position from the A1-A1 line in FIG. 2.

The semiconductor storage device 1 includes the peripheral circuit chip 200 and the memory array chip 300. The peripheral circuit chip 200 includes a semiconductor substrate 70, and peripheral circuits provided on the semiconductor substrate 70. The memory array chip 300 includes the semiconductor substrate 50, and a memory cell array provided on the semiconductor substrate 50.

The peripheral circuit chip 200 and the memory array chip 300 are bonded by conductive pads provided on their respective surfaces so that the conductive pads face each other. That is, the semiconductor storage device 1 has a structure in which the conductive pads on the upper surface of the peripheral circuit chip 200 are bonded to the conductive pads on the upper surface of the memory array chip 300.

As illustrated in FIG. 6, the memory pillars MP, and the conductive layers 51, 52, 53, and 54, etc. are disposed in the memory cell region 10 of the memory array chip 300. CMOS circuits CM, which are peripheral circuits, are disposed in the peripheral circuit region 20 of the peripheral circuit chip 200. That is, when viewed in the Z direction, the memory cell region 10 of the memory array chip 300 and the peripheral circuit region 20 of the peripheral circuit chip 200 overlap each other.

Depending on the size, etc. of a transistor forming the peripheral circuit, there may be an area where only the CMOS circuits CM are disposed, and the memory pillars MP, etc. are not disposed when viewed in the Z direction. This state is illustrated in FIG. 7.

The chain wiring 31, and the adjacent wirings 32 and 33 are disposed in the end region 30 of the memory array chip 300 and the peripheral circuit chip 200.

Hereinafter, a cross-sectional structure of the memory cell region 10 in the memory array chip 300 will be described in detail by using FIG. 6.

On the semiconductor substrate 50, the conductive layer 51 is provided via an insulating layer in the negative Z direction. On the conductive layer 51, a stacked body in which the conductive layer 52, the plurality of conductive layers 53, and the conductive layer 54 are stacked via insulating layers in the negative Z direction is provided. Each of the conductive layers 51 to 54 has a plate shape along the XY plane (i.e., parallel to the surface of the semiconductor substrate 50). The conductive layers 51 to 54 extend in the X and Y directions.

The conductive layer 51 functions as the source line SL. The conductive layer 52 functions as the select gate line SGS. The conductive layers 53 function as the plurality of word lines WL0 to WL7, respectively. The conductive layer 54 functions as the select gate line SGD. The conductive layers 51 to 54 contain, for example, tungsten (W) or polycrystalline silicon. The semiconductor substrate 50 includes, for example, a silicon substrate and a silicon epitaxial layer.

Each of the conductive layers 52 to 54 is electrically connected to a conductive layer 56A via a contact plug CP2. FIG. 6 illustrates the contact plugs CP2 connected to only certain conductive layers 53, and contact plugs connected to other conductive layers 52 and 54 are omitted. On the conductive layer 56A, a via 57A, a conductive pad 58A, a via 59A, and a conductive pad 60A are sequentially provided in the negative Z direction.

In the stacked body including the conductive layers 52 to 54, a plurality of columnar memory pillars MP is provided. Each memory pillar MP extends in the Z direction. Each memory pillar MP is disposed through the conductive layers 52 to 54 in the Z direction (or the stacking direction), and reaches the conductive layer 51 from the surface of the conductive layer 54. That is, the memory pillar MP is connected to the source line SL through the select gate line SGD, the plurality of word lines WL0 to WL7, and the select gate line SGS.

The contact plug CP1 is provided in the negative Z direction on the memory pillar MP, and the conductive layer 55 (which is the bit line BL) is provided on the contact plug CP1. On the conductive layer 55, a via 59B, and a conductive pad 60B are sequentially provided in the negative Z direction. Details of the memory pillar MP are the same as those described above with reference to FIG. 5.

A contact plug CP3 is provided in the negative Z direction on the semiconductor substrate 50, and a conductive pad 56C is provided on the contact plug CP3. On the conductive pad 56C, a via 57C, a conductive pad 58C, a via 59C, and a conductive pad 60C are sequentially provided in the negative Z direction.

Hereinafter, a cross-sectional structure of the peripheral circuit region in the peripheral circuit chip 200 will be described in detail by using FIG. 6.

On the semiconductor substrate 70, for example, a CMOS circuit CM including an n-channel MOS field effect transistor (hereinafter, referred to as an nMOS transistor), and a p-channel MOS field effect transistor (hereinafter, referred to as a pMOS transistor) are provided. The CMOS circuits CM make up the peripheral circuits that control operations of the plurality of memory cells. The semiconductor substrate 70 includes, for example, a silicon substrate and a silicon epitaxial layer.

As illustrated in FIG. 6, the semiconductor substrate 70 is provided with a source region and a drain region 70A, and an element isolation area 70B. On the semiconductor substrate 70 between the source region 70A and the drain region 70A, a gate insulating layer 71 is provided in the positive Z direction, and a gate electrode 72 is provided on the gate insulating layer 71. Each of the nMOS transistor and the pMOS transistor includes the source region 70A, the drain region 70A, a semiconductor layer of the semiconductor substrate 70, the gate insulating layer 71, and the gate electrode 72.

A via 73A is provided in the positive Z direction in each of the source region 70A and the drain region 70A, and a conductive layer 74A is provided on each via 73A. On the conductive layer 74A, a via 75A, a conductive layer 76A, a via 77A, a conductive layer 78A, a via 79A, a conductive layer 80A, a via 81A, and a conductive pad 82A are sequentially provided in the positive Z direction. The conductive pad 82A is disposed on the surface of the peripheral circuit chip 200, in the positive Z direction.

A via 73B is provided in the positive Z direction in each of the other source region 70A and the other drain region 70A, and a conductive layer 74B is provided on each via 73B. On the conductive layer 74B, a via 75B, a conductive layer 76B, a via 77B, a conductive layer 78B, a via 79B, a conductive layer 80B, a via 81B, and a conductive pad 82B are sequentially provided in the positive Z direction. The conductive pad 82B is disposed on the surface of the peripheral circuit chip 200, in the positive Z direction.

A via 73C is provided in the positive Z direction in an impurity diffusion region 70C of the semiconductor substrate 70, and a conductive layer 74C is provided on the via 73C. On the conductive layer 74C, a via 75C, a conductive layer 76C, a via 77C, a conductive layer 78C, a via 79C, a conductive layer 80C, a via 81C, and a conductive pad 82C are sequentially provided in the positive Z direction. The conductive pad 82C is disposed on the surface of the peripheral circuit chip 200, in the positive Z direction.

The peripheral circuit chip 200 and the memory array chip 300 are bonded to each other such that the conductive pad 82A faces the conductive pad 60A, the conductive pad 82B faces the conductive pad 60B, and the conductive pad 82C faces the conductive pad 60C. Accordingly, the conductive pad 82A and the conductive pad 60A are bonded and electrically connected. Similarly, the conductive pad 82B and the conductive pad 60B are bonded and electrically connected, and the conductive pad 82C and the conductive pad 60C are bonded and electrically connected.

Next, a cross-sectional structure of the end region 30 in the peripheral circuit chip 200 and the memory array chip 300 will be described in detail by using FIGS. 6, 8 and 9.

Figure 8:
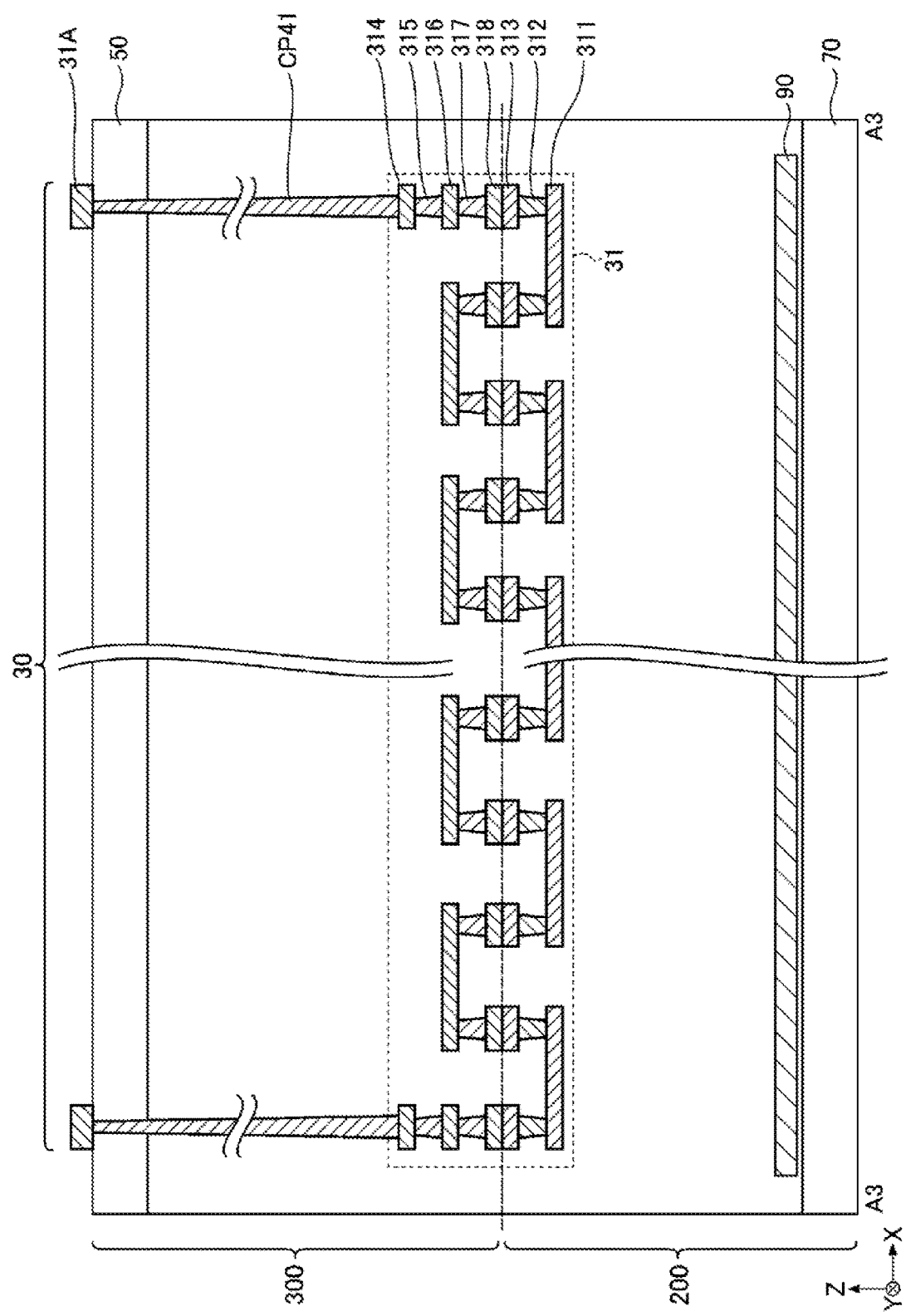
FIG. 8 is a cross-sectional view taken along the A3-A3 line in FIG. 2.

FIG. 8 is a cross-sectional view taken along the A3-A3 line in FIG. 2, and is a cross-sectional view taken along the XZ plane in the chain wiring 31 in the end region 30. FIG. 9 is a cross-sectional view taken along the A4-A4 line in FIG. 2, and is a cross-sectional view taken along the XZ plane in the adjacent wiring 32 in the end region 30.

In the end region 30, as described above, the chain wiring 31, and the adjacent wirings 32 and 33 which are disposed with the chain wiring 31 interposed therebetween and are adjacent to the chain wiring 31 are provided.

Hereinafter, a cross-sectional structure of the chain wiring 31 will be described.

As illustrated in FIG. 6 and FIG. 8, the chain wiring 31 has a conductive layer 311, a via 312, and a conductive pad 313 in the peripheral circuit chip 200, and has a conductive layer 314, a via 315, a conductive layer 316, a via 317, and a conductive pad 318 in the memory array chip 300. These conductive layers, vias, and conductive pads are electrically connected to form the chain wiring 31.

The conductive pad 313 is provided on the upper surface of the peripheral circuit chip 200. Specifically, the conductive pad 313 is provided on the bonding surface between the peripheral circuit chip 200 and the memory array chip 300, on the peripheral circuit chip 200 side. On the conductive pad 313, the via 312, and the conductive layer 311 are sequentially provided in the negative Z direction (or on the semiconductor substrate 70 side).

On the semiconductor substrate 70, a conductive layer 90 is provided via an insulating layer in the positive Z direction. The conductive layer 90 functions as a crack stopper that stops cracks occurring from the dicing line. The conductive layer 90 also functions as a stopper that prevents intrusion of pollutants from the side surface of the semiconductor storage device 1.

The conductive pad 318 is provided on the upper surface of the memory array chip 300. Specifically, the conductive pad 318 is provided on the bonding surface between the peripheral circuit chip 200 and the memory array chip 300, on the memory array chip 300 side. On the conductive pad 318, the via 317, the conductive layer 316, the via 315, and the conductive layer 314 are sequentially provided in the positive Z direction (or on the semiconductor substrate 50 side). A contact plug CP41 is provided on the conductive layer 314 in the positive Z direction.

The contact plug CP41 passes through the semiconductor substrate 50, and reaches the exterior surface of the semiconductor substrate 50. The conductive pad 31A is provided on the contact plug CP41, on the exterior surface of the semiconductor substrate 50. The conductive pad 31A is electrically connected to the contact plug CP41. Through such a structure, the conductive pad 31A is electrically connected to the contact plug CP41, the conductive layer 314, the via 315, the conductive layer 316, the via 317, and the conductive pad 318.

Hereinafter, a cross-sectional structure of the adjacent wiring 32 will be described.

Figure 9:
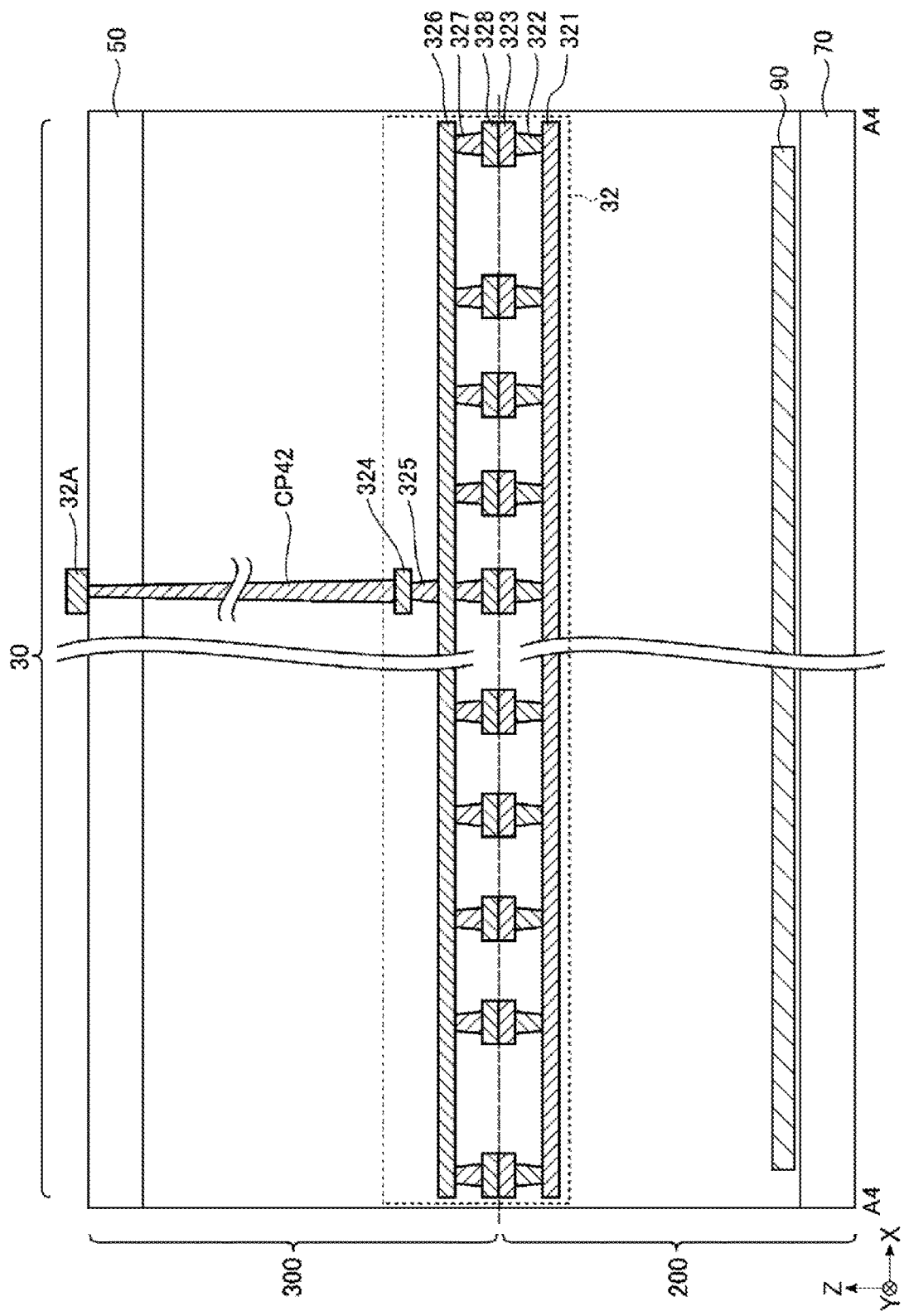
FIG. 9 is a cross-sectional view taken along the A4-A4 line in FIG. 2.

As illustrated in FIG. 6 and FIG. 9, the adjacent wiring 32 has a conductive layer 321, a via 322, and a conductive pad 323 in the peripheral circuit chip 200, and has a conductive layer 324, a via 325, a conductive layer 326, a via 327, and a conductive pad 328 in the memory array chip 300. These conductive layers, vias, and conductive pads are electrically connected to form the adjacent wiring 32.

The conductive pad 323 is provided on the upper surface of the peripheral circuit chip 200. Specifically, the conductive pad 323 is provided on the bonding surface between the peripheral circuit chip 200 and the memory array chip 300, on the peripheral circuit chip 200 side. On the conductive pad 323, the via 322, and the conductive layer 321 are sequentially provided in the negative Z direction (or on the semiconductor substrate 70 side). On the semiconductor substrate 70, the conductive layer 90 is provided via the insulating layer in the positive Z direction.

The conductive pad 328 is provided on the upper surface of the memory array chip 300. Specifically, the conductive pad 328 is provided on the bonding surface between the peripheral circuit chip 200 and the memory array chip 300, on the memory array chip 300 side. On the conductive pad 328, the via 327, the conductive layer 326, the via 325, and the conductive layer 324 are sequentially provided in the positive Z direction (or on the semiconductor substrate 50 side). A contact plug CP42 is provided on the conductive layer 324 in the positive Z direction.

The contact plug CP42 passes through the semiconductor substrate 50 and reaches the exterior surface of the semiconductor substrate 50. The conductive pad 32A is provided on the contact plug CP42, on the exterior surface of the semiconductor substrate 50. The conductive pad 32A is electrically connected to the contact plug CP42. Through such a structure, the conductive pad 32A is electrically connected to the contact plug CP42, the conductive layer 324, the via 325, the conductive layer 326, the via 327, and the conductive pad 328.

Hereinafter, a cross-sectional structure of the adjacent wiring 33 will be described. The adjacent wiring 33 is different from the adjacent wiring 32 in an arrangement place, and is disposed on the side of the chain wiring 31 opposite to a location where the adjacent wiring 32 is disposed. The cross-sectional structure of the adjacent wiring 33 is substantially the same as the cross-sectional structure of the adjacent wiring 32, and thus the cross-sectional view taken along the XZ plane is omitted.

As illustrated in FIG. 6, the adjacent wiring 33 has a conductive layer 331, a via 332, and a conductive pad 333 in the peripheral circuit chip 200, and has a conductive layer 334, a via 335, a conductive layer 336, a via 337, and a conductive pad 338 in the memory array chip 300. These conductive layers, vias, and conductive pads are electrically connected to form the adjacent wiring 33.

The conductive pad 333 is provided on the upper surface of the peripheral circuit chip 200. Specifically, the conductive pad 333 is provided on the bonding surface between the peripheral circuit chip 200 and the memory array chip 300, on the peripheral circuit chip 200 side. On the conductive pad 333, the via 332, and the conductive layer 331 are sequentially provided in the negative Z direction (or on the semiconductor substrate 70 side). On the semiconductor substrate 70, the conductive layer 90 is provided via the insulating layer in the positive Z direction.

The conductive pad 338 is provided on the upper surface of the memory array chip 300. Specifically, the conductive pad 338 is provided on the bonding surface between the peripheral circuit chip 200 and the memory array chip 300, on the memory array chip 300 side. On the conductive pad 338, the via 337, the conductive layer 336, the via 335, and the conductive layer 334 are sequentially provided in the positive Z direction (or on the semiconductor substrate 50 side). A contact plug CP43 is provided on the conductive layer 334 in the positive Z direction.

The contact plug CP43 passes through the semiconductor substrate 50, and reaches the exterior surface of the semiconductor substrate 50. The conductive pad 33A is provided on the contact plug CP43, on the exterior surface of the semiconductor substrate 50. The conductive pad 33A is electrically connected to the contact plug CP43. Through such a structure, the conductive pad 33A is electrically connected to the contact plug CP43, the conductive layer 334, the via 335, the conductive layer 336, the via 337, and the conductive pad 338.

The peripheral circuit chip 200 and the memory array chip 300 are bonded to each other such that the conductive pad 313 faces the conductive pad 318, the conductive pad 323 faces the conductive pad 328, and the conductive pad 333 faces the conductive pad 338. Accordingly, the conductive pad 313 and the conductive pad 318 are bonded and electrically connected. Similarly, the conductive pad 323 and the conductive pad 328 are bonded and electrically connected, and the conductive pad 333 and the conductive pad 338 are bonded and electrically connected.

FIG. 6 illustrates an example in which the peripheral circuits are provided below the memory pillars in the memory cell region 10, i.e., overlapping when viewed in the Z direction, but the present disclosure is not limited thereto.

Figure 10:
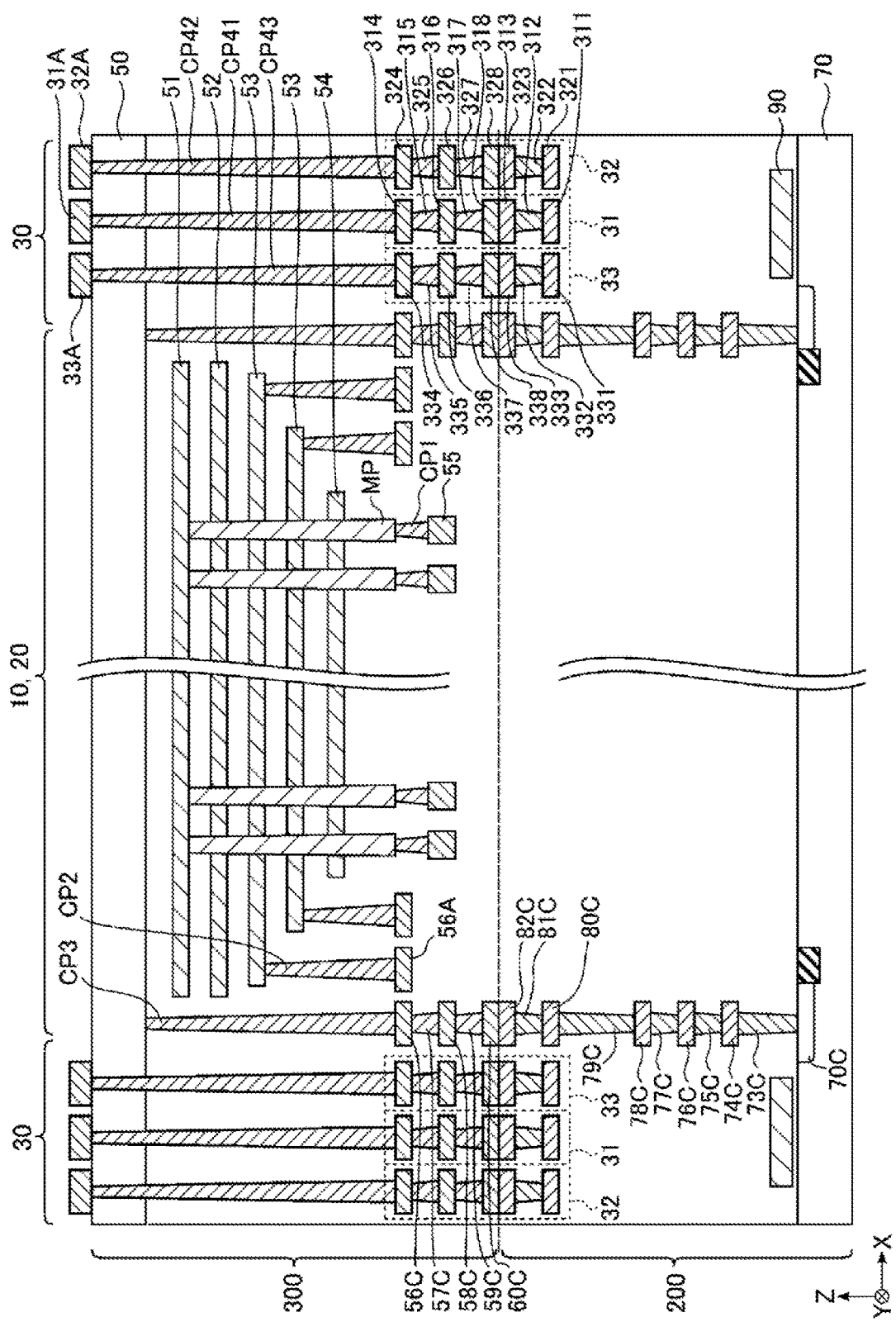
FIGS. 10-11 are each a cross-sectional view of the memory cell region, the peripheral circuit region, and the end region in a different portion of the semiconductor storage device.
Figure 11:
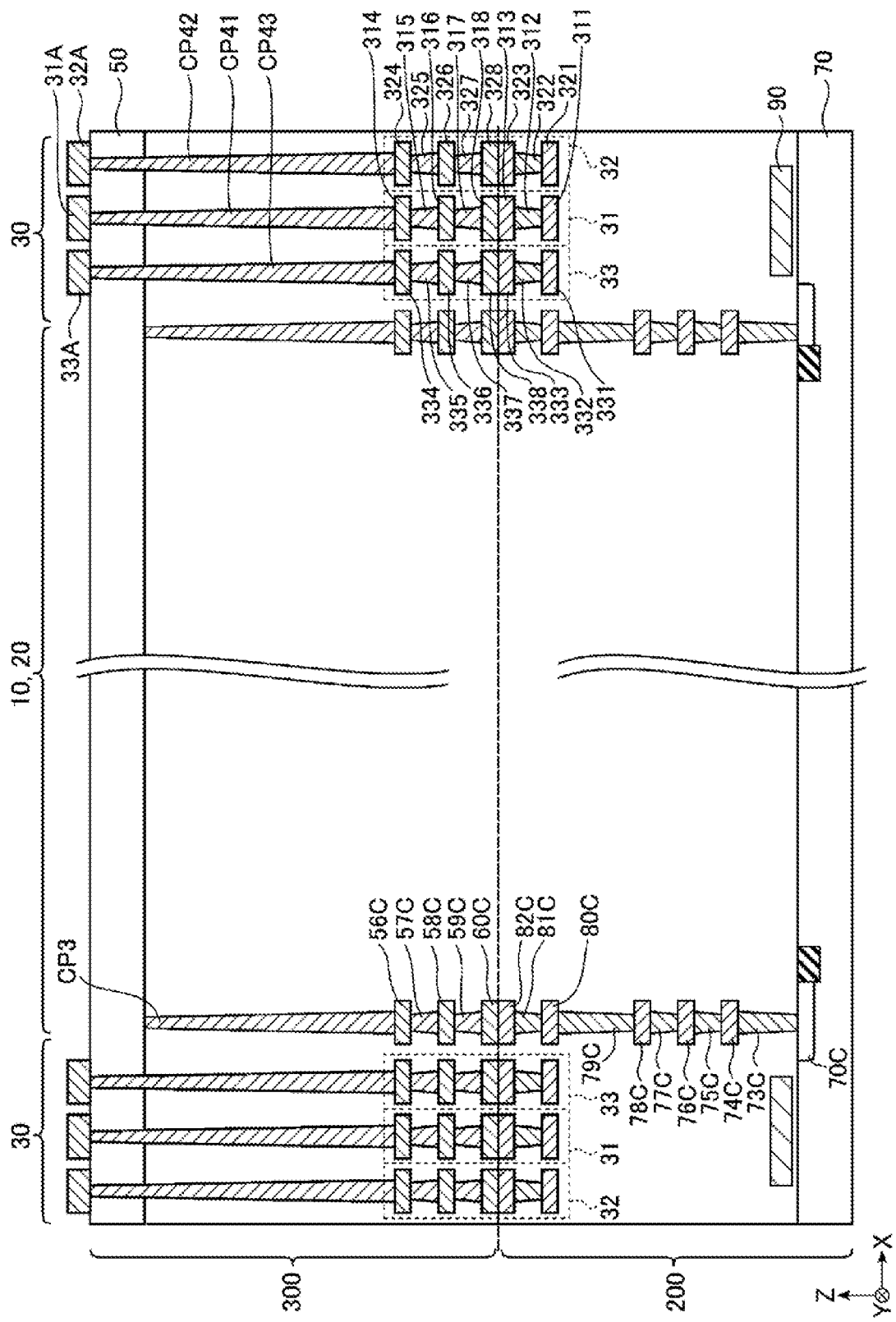

In the semiconductor storage device 1, there may be a portion where the peripheral circuits are not provided below the memory pillars in the memory cell region 10, i.e., overlapping when viewed in the Z direction. This state is illustrated in FIG. 10. In addition, depending on the layout of each element in the memory cell region 10 and the peripheral circuit region 20, there may be another portion where neither the memory cell array nor the peripheral circuit is provided when viewed in the Z direction. This state is illustrated in FIG. 11.

1.1.4 Details of End Region in Semiconductor Storage Device

Next, details of the chain wiring 31, and the adjacent wirings 32 and 33 in the end region 30 will be described by using FIG. 12 to FIG. 16. In FIG. 12 to FIG. 16, the vias 315, 325, and 335, the conductive layers 314, 324, and 334, and the contact plugs CP41, CP42, and CP43 are omitted.

Figure 12:
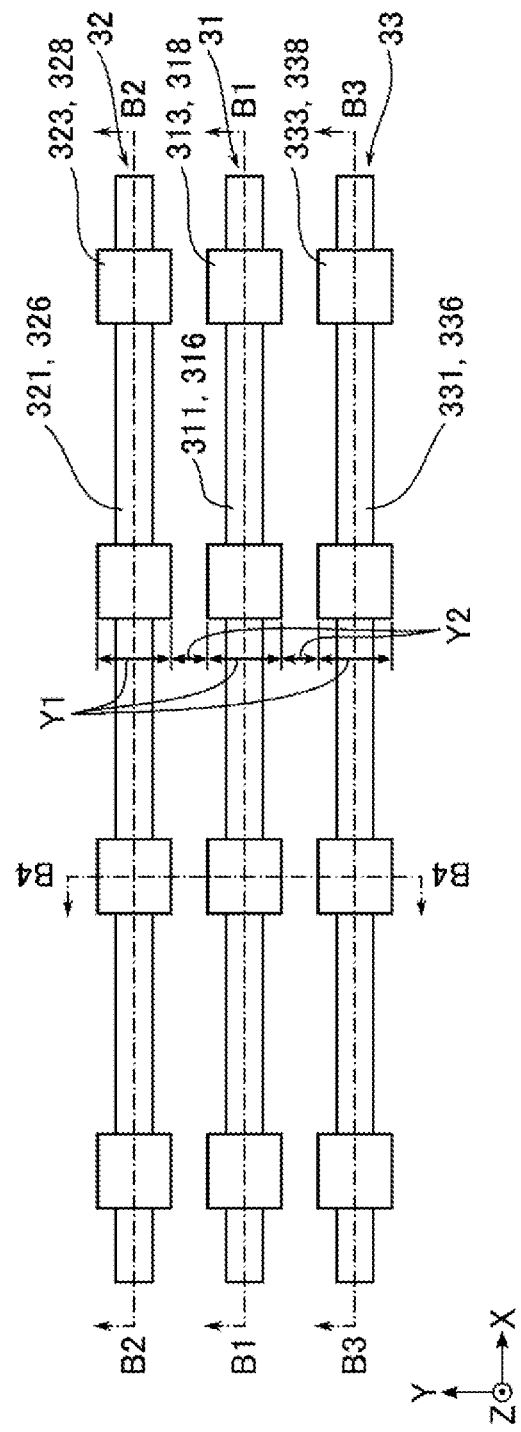
FIG. 12 is a plan view illustrating a chain wiring and adjacent wirings provided in the end region in the semiconductor storage device.

FIG. 12 is a plan view schematically illustrating the chain wiring 31 and the adjacent wirings 32 and 33 provided in the end region 30 of the semiconductor storage device 1. FIG. 12 illustrates the chain wiring 31 and the adjacent wirings 32 and 33 along the top side TS. Along the left side LS, the right side RS, and the bottom side BS, the chain wiring 31, and the adjacent wirings 32 and 33 have the same structures as those illustrated in FIG. 12 to FIG. 16 except that different conductive pads are employed for electrical resistance measurement described below.

Figure 13:
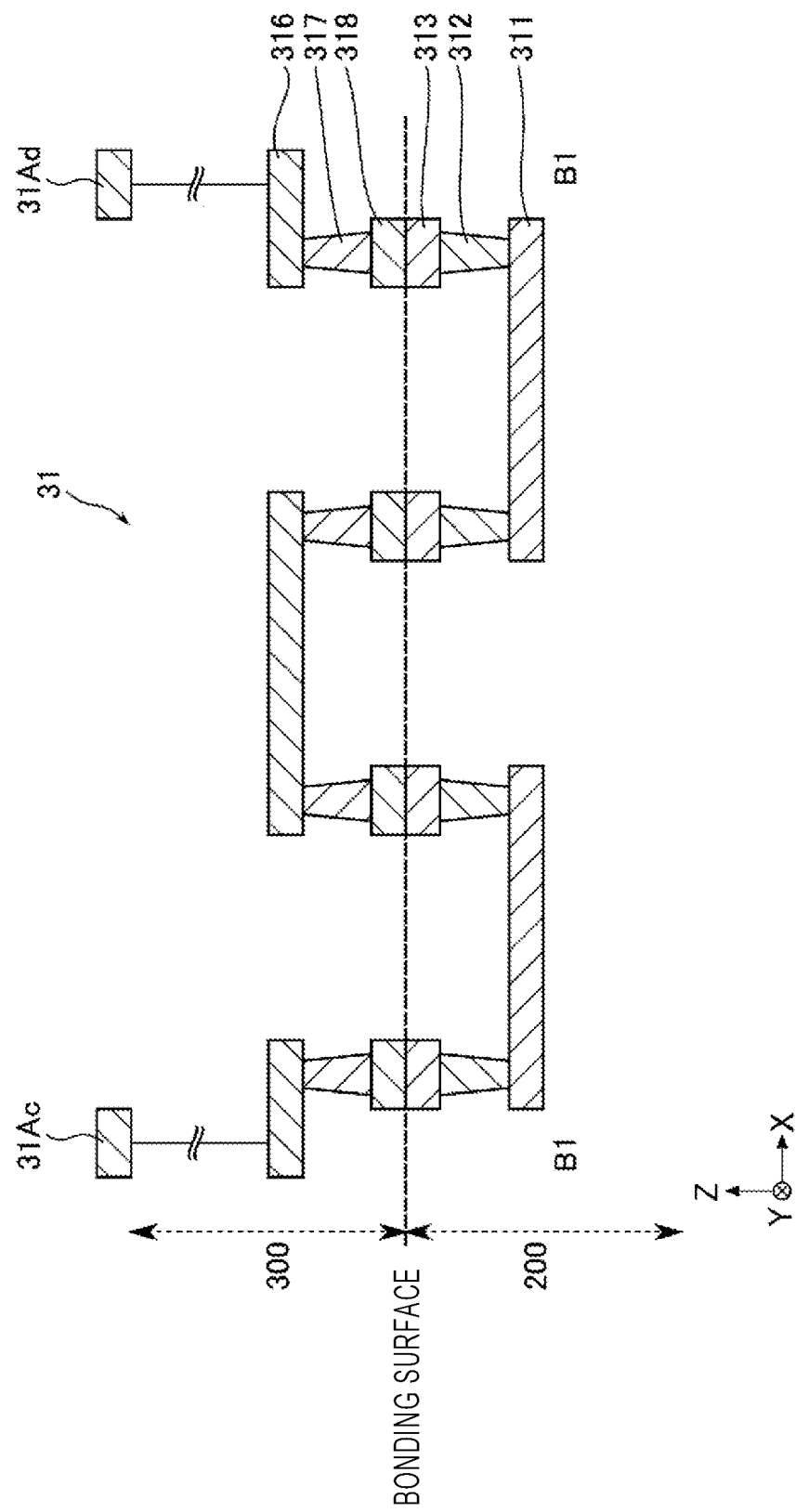
FIG. 13 is a cross-sectional view taken along the B1-B1 line in FIG. 12.
Figure 14:
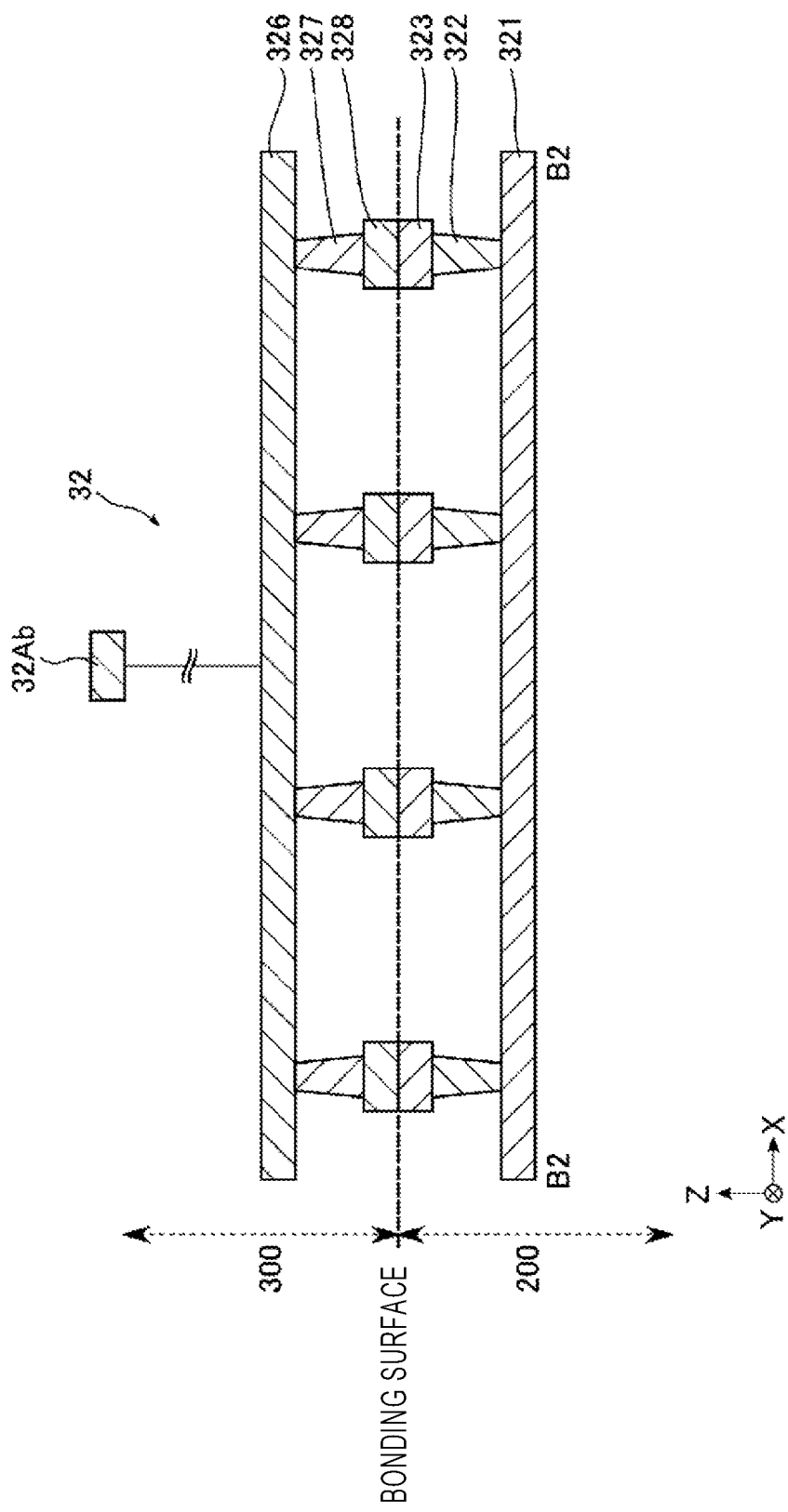
FIG. 14 is a cross-sectional view taken along the B2-B2 line in FIG. 12.
Figure 15:
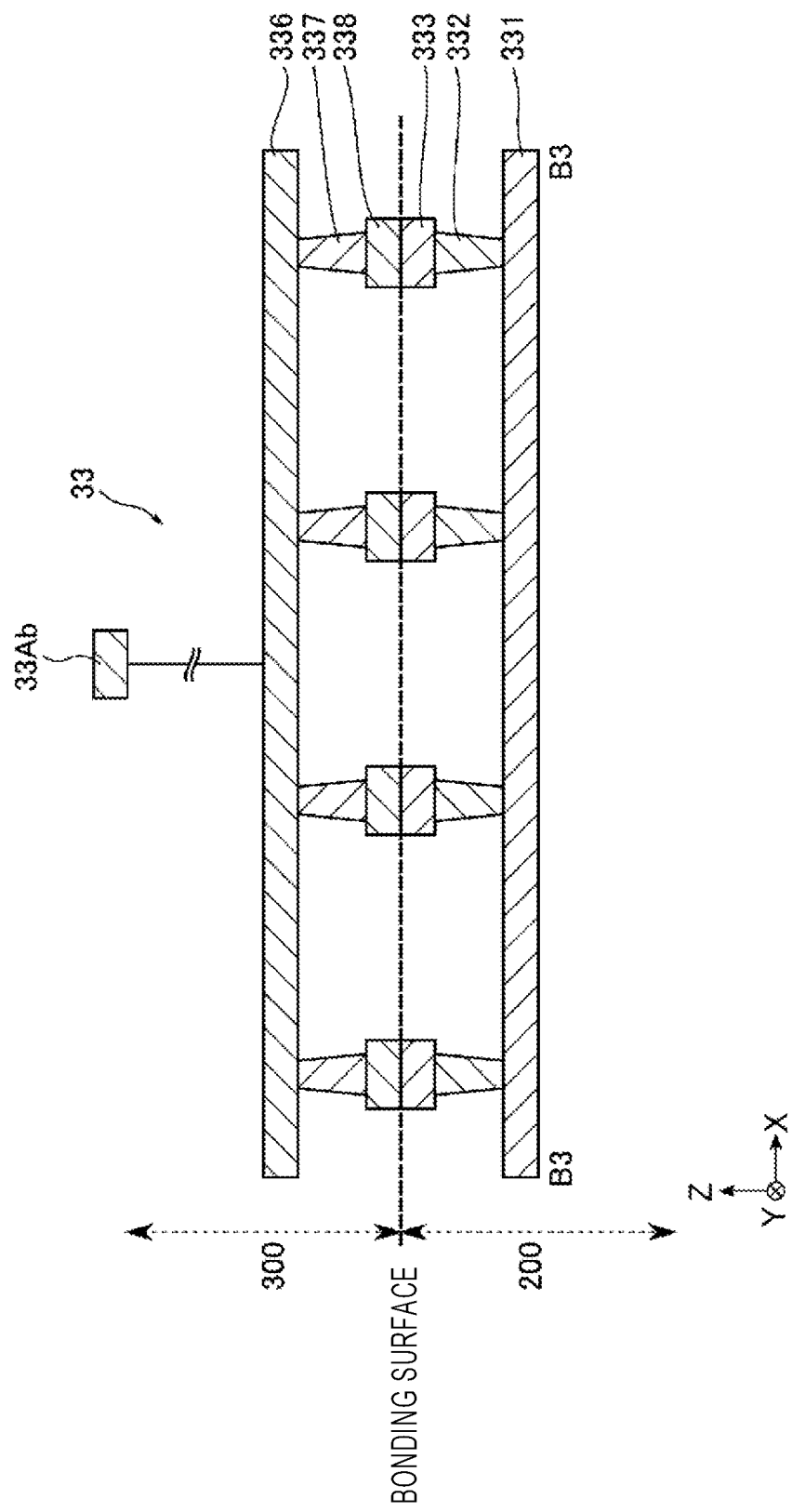
FIG. 15 is a cross-sectional view taken along the B3-B3 line in FIG. 12.
Figure 16:
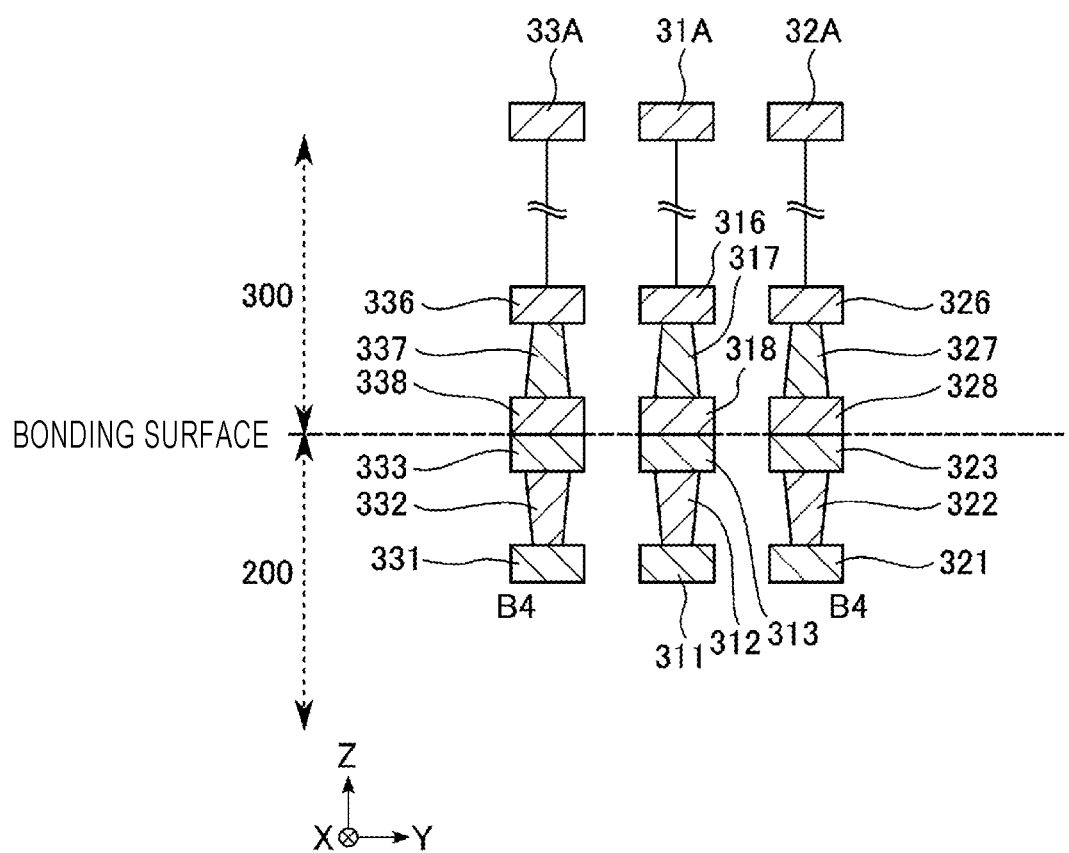
FIG. 16 is a cross-sectional view taken along the B4-B4 line in FIG. 12.

FIG. 13 is a cross-sectional view taken along the B1-B1 line (or the chain wiring 31) in FIG. 12, and FIG. 14 is a cross-sectional view taken along the B2-B2 line (or the adjacent wiring 32) in FIG. 12. FIG. 15 is a cross-sectional view taken along the B3-B3 line (or the adjacent wiring 33) in FIG. 12. FIG. 16 is a cross-sectional view taken along the B4-B4 line in FIG. 12.

As illustrated in FIG. 12, the chain wiring 31 and the adjacent wirings 32 and 33 are provided in the end region 30. The chain wiring 31 and the adjacent wirings 32 and 33 are disposed adjacent to each other. The chain wiring 31 is disposed between the adjacent wirings 32 and 33.

As illustrated in FIG. 12, FIG. 13 and FIG. 16, the chain wiring 31 includes the conductive pad 313, the via 312, and the conductive layer 311 in the peripheral circuit chip 200, and the conductive pad 318, the via 317, and the conductive layer 316 in the memory array chip 300.

As illustrated in FIG. 13, in the peripheral circuit chip 200, the conductive layer 311 extends in the X direction. The plurality of conductive pads 313 is arranged at predetermined intervals in the X direction. One conductive pad 313 is electrically connected to one end of the conductive layer 311 through the via 312. Another conductive pad 313 is electrically connected to the other end of the conductive layer 311 through the via 312.

In the memory array chip 300, the conductive layer 316 extends in the X direction. The plurality of conductive pads 318 is arranged at predetermined intervals in the X direction. One conductive pad 318 is electrically connected to one end of the conductive layer 316 through the via 317. Another conductive pad 318 is electrically connected to the other end of the conductive layer 316 through the via 317.

The conductive pads 313 are provided on the upper surface of the peripheral circuit chip 200. The conductive pads 318 are provided on the upper surface of the memory array chip 300. The conductive pads 313 and the conductive pads 318 are disposed at locations aligned with each other in the Z direction. The conductive pads 313 and the conductive pads 318 are bonded such that the conductive pads 313 and the conductive pads 318 face each other.

The conductive pad 31Ac is electrically connected to one end of one conductive layer 316 through the via 315, the conductive layer 314, and the contact plug CP41 (not illustrated). The conductive pad 31Ad is electrically connected to one end of another conductive layer 316 through the via 315, the conductive layer 314, and the contact plug CP41.

Through such a structure, the conductive pad 31Ac and the conductive pad 31Ad are electrically connected to each other via the conductive layer 316, the via 317, the conductive pad 318, the conductive pad 313, the via 312, and the conductive layer 311. The conductive pads 313 and 318 may be regularly arranged at predetermined intervals in the X direction, or may be arranged at any intervals specified by the design.

As illustrated in FIGS. 12, 14 and 16, the adjacent wiring 32 includes the conductive pad 323, the via 322, and the conductive layer 321 in the peripheral circuit chip 200, and the conductive pad 328, the via 327, and the conductive layer 326 in the memory array chip 300.

As illustrated in FIG. 14, in the peripheral circuit chip 200, the conductive layer 321 extends in the X direction. The plurality of conductive pads 323 is arranged at predetermined intervals in the X direction. Each conductive pad 323 is electrically connected to the conductive layer 321 through the via 322. In the memory array chip 300, the conductive layer 326 extends in the X direction. The plurality of conductive pads 328 is arranged at predetermined intervals in the X direction. Each conductive pad 328 is electrically connected to the conductive layer 326 through the via 327.

The conductive pads 323 are provided on the upper surface of the peripheral circuit chip 200. The conductive pads 328 are provided on the upper surface of the memory array chip 300. The conductive pads 323 and 328 are disposed at locations aligned with each other in the Z direction. The conductive pads 323 and the conductive pads 328 are bonded such that they face each other.

The conductive pads 313, 318, 323, 328, 333, and 338 are formed with, for example, the same dimensions when viewed in the Z direction, and have rectangular shapes. A dimension Y1 of each conductive pad in the Y direction is larger than an interval Y2 between conductive pads adjacent to each other in the Y direction.

The conductive pad 32Ab is electrically connected to the conductive layer 326 through the via 325, the conductive layer 324, and the contact plug CP42 (not illustrated).

Through such a structure, the conductive pad 32Ab is electrically connected to the conductive layer 326, the via 327, the conductive pad 328, the conductive pad 323, the via 322, and the conductive layer 321. The conductive pads 323 and 328 may be regularly arranged at predetermined intervals in the X direction, or may be arranged at any intervals specified by the design.

The structure of the adjacent wiring 33 is almost the same as that of the adjacent wiring 32. As illustrated in FIGS. 12 and 15, the adjacent wiring 33 includes the conductive pad 333, the via 332, and the conductive layer 331 in the peripheral circuit chip 200, and the conductive pad 338, the via 337, and the conductive layer 336 in the memory array chip 300.

In the peripheral circuit chip 200, the conductive layer 331 extends in the X direction. The plurality of conductive pads 333 is arranged at predetermined intervals in the X direction. Each conductive pad 333 is electrically connected to the conductive layer 331 through the via 332. In the memory array chip 300, the conductive layer 336 extends in the X direction. The plurality of conductive pads 338 is arranged at predetermined intervals in the X direction. Each conductive pad 338 is electrically connected to the conductive layer 336 through the via 337.

The conductive pads 333 are provided on the upper surface of the peripheral circuit chip 200. The conductive pads 338 are provided on the upper surface of the memory array chip 300. The conductive pads 333 and 338 are disposed at locations aligned with each other in the Z direction. The conductive pads 333 and the conductive pads 338 are bonded such that the conductive pads 333 and the conductive pads 338 face each other.

The conductive pad 33Ab is electrically connected to the conductive layer 336 through the via 335, the conductive layer 334, and the contact plug CP43 (not illustrated).

Through such a structure, the conductive pad 33Ab is electrically connected to the conductive layer 336, the via 337, the conductive pad 338, the conductive pad 333, the via 332, and the conductive layer 331. The conductive pads 333 and 338 may be regularly arranged at predetermined intervals in the X direction, or may be arranged at any intervals specified by the design.

1.2 Operation of First Embodiment

In the first embodiment, the chain wiring 31 is used to detect a bonding state (or an electrical connection state) by evaluating the bonding between the conductive pads 313 of the peripheral circuit chip 200 and the conductive pads 318 of the memory array chip 300. That is, it is detected whether a connection failure such as peeling is not occurring between the conductive pads 313 of the peripheral circuit chip 200, and the conductive pads 318 of the memory array chip 300.

The chain wiring 31 has a pasting portion (or a bonding portion) at which the conductive pads 313 of the peripheral circuit chip 200 and the conductive pads 318 of the memory array chip 300 are bonded, and the conductive pads 313 and the conductive pads 318 are electrically connected as a result of the bonding. The conductive pad 31Ac is electrically connected to one end of the chain wiring 31, and the conductive pad 31Ad is electrically connected to the other end of the chain wiring 31.

In the first embodiment, an electrical connection state between the conductive pad 31Ac and the conductive pad 31Ad is examined. For example, an electrical resistance between the conductive pad 31Ac and the conductive pad 31Ad is measured by using a probe device.

When the electrical resistance between the conductive pad 31Ac and the conductive pad 31Ad is equal to or less than a predetermined resistance value, it is determined that there is no problem caused by peeling, etc. at the bonding portion between the conductive pads 313 of the peripheral circuit chip 200 and the conductive pads 318 of the memory array chip 300. Meanwhile, when the electrical resistance between the conductive pad 31Ac and the conductive pad 31Ad is higher than the predetermined resistance value, it is determined that peeling, etc. has occurred at the bonding portion between the conductive pads 313 of the peripheral circuit chip 200 and the conductive pads 318 of the memory array chip 300.

As described above, after the conductive pads 313 of the peripheral circuit chip 200 and the conductive pads 318 of the memory array chip 300 are bonded, a bonding state or an electrical connection state between the conductive pads of the peripheral circuit chip 200 and the conductive pads of the memory array chip 300 is detected by measuring the electrical resistance between the conductive pad 31Ac and the conductive pad 31Ad.

The chain wiring 31 is provided along four sides of the semiconductor storage device 1, that is, the left side LS, the right side RS, the top side TS, and the bottom side BS. An electrical resistance is measured for each chain wiring corresponding to each of the left side LS, the right side RS, the top side TS, and the bottom side BS by using the conductive pad connected to one end of each chain wiring and the conductive pad connected to the other end of each chain wiring. Accordingly, among chain wirings corresponding to the left side LS, the right side RS, the top side TS, and the bottom side BS, respectively, it is possible to detect in which chain wiring peeling of a conductive pad has occurred. For example, when an electrical resistance between the conductive pad 31Aa and the conductive pad 31Ab is measured, it is possible to detect whether peeling occurs at the bonding portion between the conductive pads 313 and the conductive pads 318, in the chain wiring 31 corresponding to the left side LS.

Further, in the first embodiment, the chain wiring 31 and the adjacent wirings 32 and 33 are used to detect misalignment in bonding between the peripheral circuit chip 200 and the memory array chip 300. That is, it is detected whether misalignment is present or not between the conductive pads of the peripheral circuit chip 200 and the conductive pads of the memory array chip 300, in bonding between the peripheral circuit chip 200 and the memory array chip 300.

In the peripheral circuit chip 200 or the memory array chip 300, the adjacent wirings 32 and 33 are arranged at a predetermined distance from the chain wiring 31 so that the chain wiring 31 is interposed therebetween. After the peripheral circuit chip 200 and the memory array chip 300 are bonded, when an amount of misalignment occurring between the peripheral circuit chip 200 and the memory array chip 300 is smaller than the predetermined distance, the chain wiring 31 and the adjacent wiring 32 or 33 are not in contact with each other, and the chain wiring and the adjacent wirings are electrically insulated from each other. Meanwhile, when an amount of the misalignment is equal to or larger than the predetermined distance, the chain wiring 31 and the adjacent wiring 32 or 33 are in contact with each other, and the chain wiring and the adjacent wirings are placed in a conductive state or a low resistance state.

In the first embodiment, an electrical connection state between the conductive pad 31Ac, and the conductive pad 32Ab or 33Ab is examined. For example, an electrical resistance between the conductive pad 31Ac and the conductive pad 32Ab, and between the conductive pad 31Ac and the conductive pad 33Ab is measured by using a probe device.

When the electrical resistance between the conductive pad 31Ac and the conductive pad 32Ab or 33Ab is very large, and the conductive pad 31Ac and the conductive pad 32Ab or 33Ab are insulated from each other, it is determined that an amount of misalignment occurring at bonding locations between the peripheral circuit chip 200 and the memory array chip 300 falls within an allowable range. Meanwhile, when the electrical resistance between the conductive pad 31Ac and the conductive pad 32Ab or 33Ab is very small, indicating that the conductive pad 31Ac and the conductive pad 32Ab or 33Ab are placed in a conductive state, it is determined that an amount of misalignment occurring at bonding locations between the peripheral circuit chip 200 and the memory array chip 300 exceeds an allowable range.

As described above, after the conductive pads of the peripheral circuit chip 200 and the conductive pads of the memory array chip 300 are bonded, it is possible to detect whether an amount of misalignment at bonding locations between the peripheral circuit chip 200 and the memory array chip 300 falls within an allowable range by measuring the electrical connection state between the conductive pad 31Ac and the conductive pad 32Ab or 33Ab.

The chain wiring 31 and the adjacent wirings 32 and 33 are provided along four sides of the semiconductor storage device 1. Thus, among adjacent wirings provided along the four sides, depending on which adjacent wiring 32 or 33 is placed in a conductive state with respect to the chain wiring 31, it is possible to detect in which direction, for example, in which direction of the X direction and the Y direction, misalignment is occurring.

1.3 Effect of First Embodiment

According to the first embodiment, as described above, by using the chain wiring 31 and the adjacent wirings 32 and 33 provided in the end region 30, it is possible to detect a bonding failure (or a peeling failure) at bonding locations between the peripheral circuit chip 200 and the memory array chip 300, that is, a bonding failure between the conductive pads of the peripheral circuit chip 200 and the conductive pads of the memory array chip 300.

It is possible to detect whether there is peeling between conductive pads in each of chain wirings corresponding to the left side LS, the right side RS, the top side TS, and the bottom side BS of the semiconductor storage device 1. Thus, it is possible to specify a location where peeling is occurring between the conductive pads, thereby facilitating analysis of a peeling failure.

By using the chain wiring 31 and the adjacent wirings 32 and 33 in the end region 30, it is possible to detect a misalignment at bonding locations between the peripheral circuit chip 200 and the memory array chip 300, that is, whether an amount of misalignment between the conductive pads of the peripheral circuit chip 200 and the conductive pads of the memory array chip 300 falls within an allowable range.

It is possible to detect misalignment in the chain wiring and the adjacent wirings corresponding to each of the left side LS, the right side RS, the top side TS, and the bottom side BS of the semiconductor storage device 1. Thus, it is possible to specify in which direction the misalignment is occurring, thereby facilitating analysis of a misalignment.

As described above, according to the first embodiment, it is possible to easily detect a bonding failure (or a peeling failure), and a misalignment between conductive pads at bonding locations between the peripheral circuit chip 200 and the memory array chip 300. Accordingly, it is possible to reduce the number of defective semiconductor storage devices, and further to provide semiconductor storage devices capable of improving an operation reliability. Since it is possible to facilitate analysis on the bonding failure and the misalignment between the peripheral circuit chip 200 and the memory array chip 300, it is possible to improve productivity of the semiconductor storage devices.

2. Second Embodiment

In a second embodiment, descriptions will be made on a chain wiring and adjacent wirings having a different configuration from the chain wiring 31 and the adjacent wirings 32 and 33 in the first embodiment. Configurations and operations not described below are the same as those in the first embodiment. In the second embodiment, differences from the first embodiment will be mainly described.

The second embodiment is an example in which conductive layers are added to the chain wiring and the adjacent wiring in each of the peripheral circuit chip 200 and the memory array chip 300. In the peripheral circuit chip 200, a conductive layer is further provided closer to the semiconductor substrate 70 side than the conductive layer 311. In the memory array chip 300, a conductive layer is further provided closer to the semiconductor substrate 50 side than the conductive layer 316.

2.1 Details of End Region in Second Embodiment

Descriptions will be made on details of the chain wiring, and the adjacent wirings in the end region 30 in the second embodiment by using FIGS. 17 to 21. In the second embodiment, FIGS. 17 to 21 illustrate only conductive layers, vias and conductive pads of the chain wiring and the adjacent wirings, and other configurations are omitted. The same also applies to following embodiments.

Figure 17:
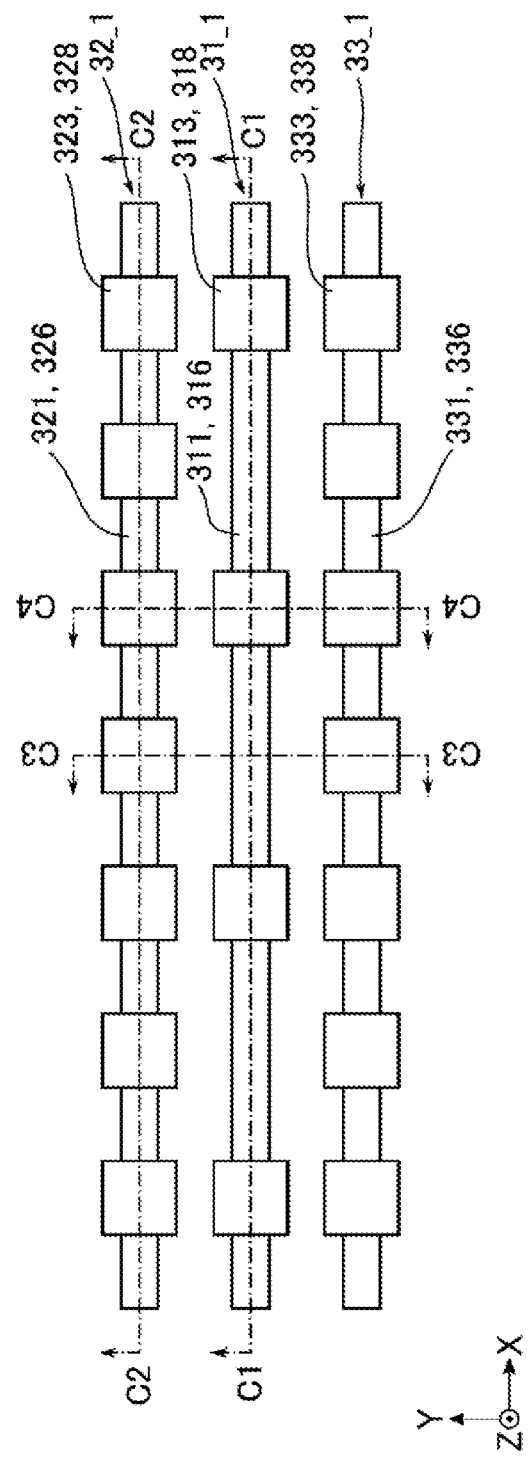
FIG. 17 is a plan view illustrating a chain wiring and adjacent wirings provided in the end region in a semiconductor storage device of a second embodiment.

FIG. 17 is a plan view schematically illustrating a chain wiring 31_1 and adjacent wirings 32_1 and 33_1 provided in the end region 30 in the second embodiment. FIG. 17 illustrates the chain wiring 31_1 and the adjacent wirings 32_1 and 33_1 along the top side TS. Along the left side LS, the right side RS, and the bottom side BS, the chain wiring 31_1 and the adjacent wirings 32_1 and 33_1 have the same structures as those illustrated in FIGS. 17 to 21 except that different conductive pads are employed for electrical resistance measurement.

Figure 18:
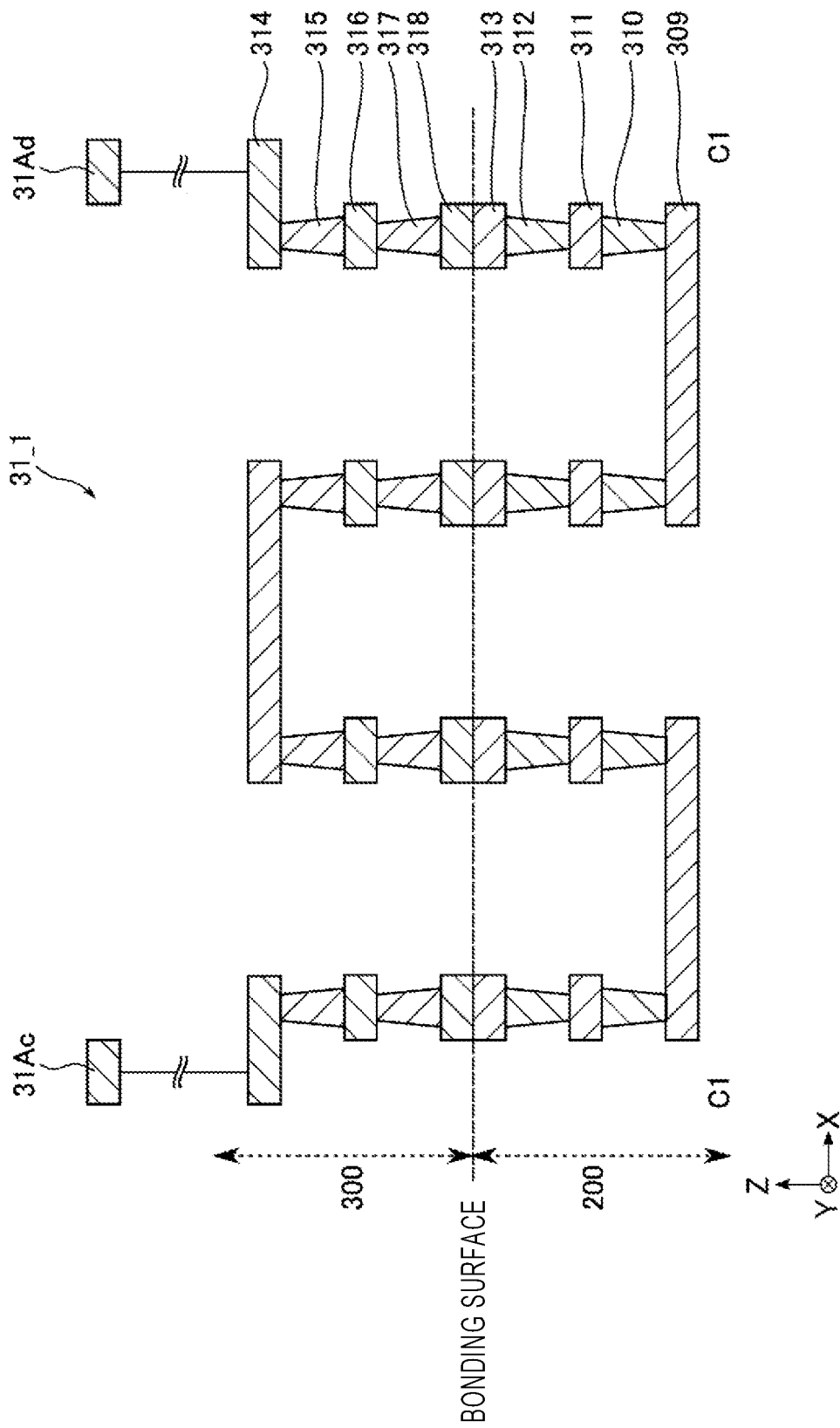
FIG. 18 is a cross-sectional view taken along the C1-C1 line in FIG. 17.
Figure 19:
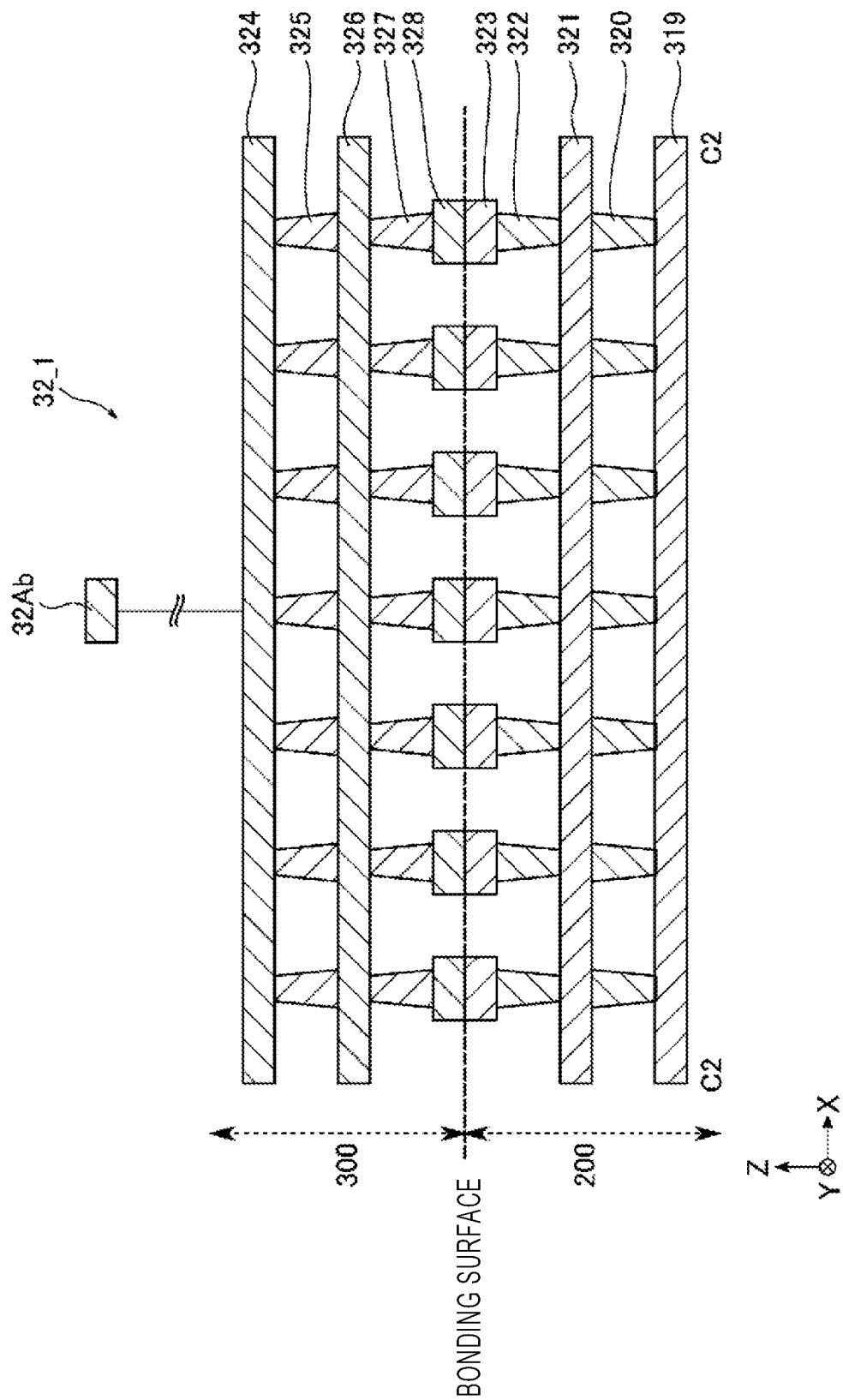
FIG. 19 is a cross-sectional view taken along the C2-C2 line in FIG. 17.
Figure 20:
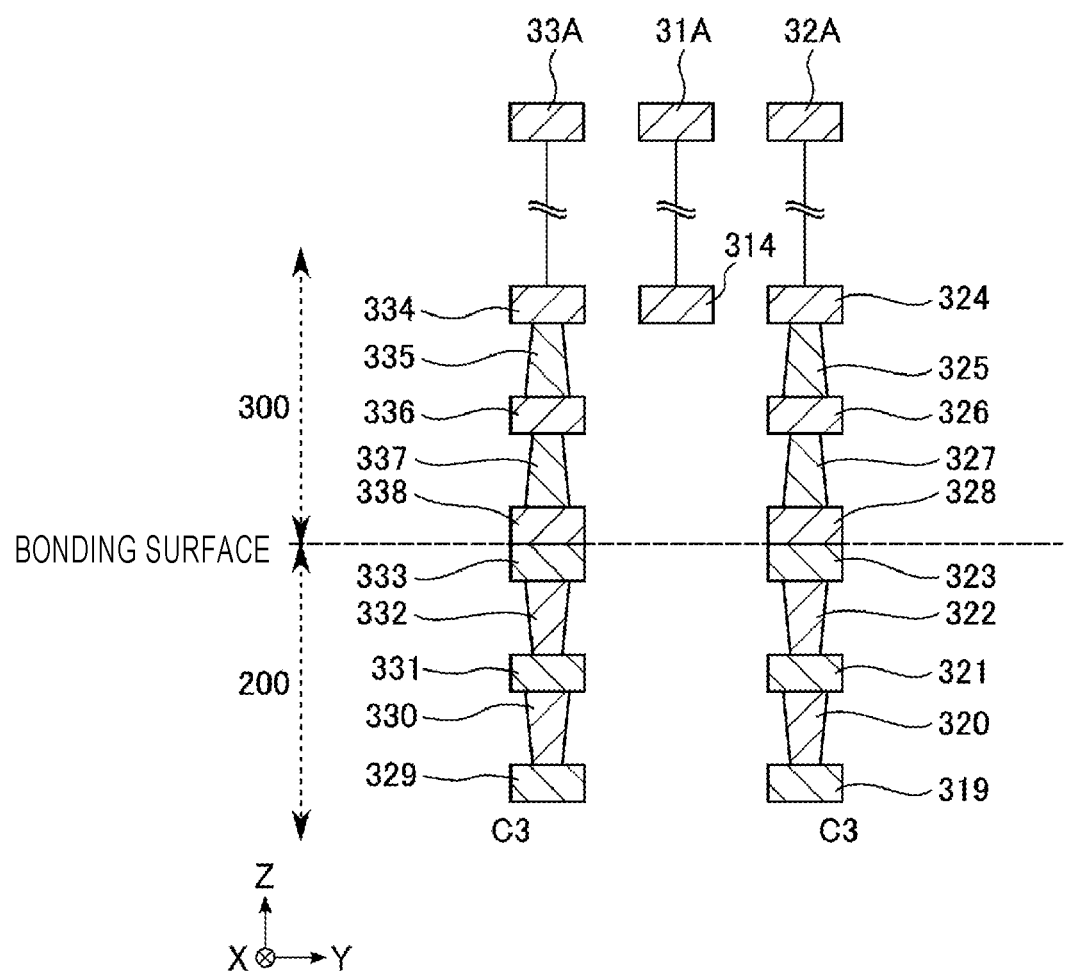
FIG. 20 is a cross-sectional view taken along the C3-C3 line in FIG. 17.
Figure 21:
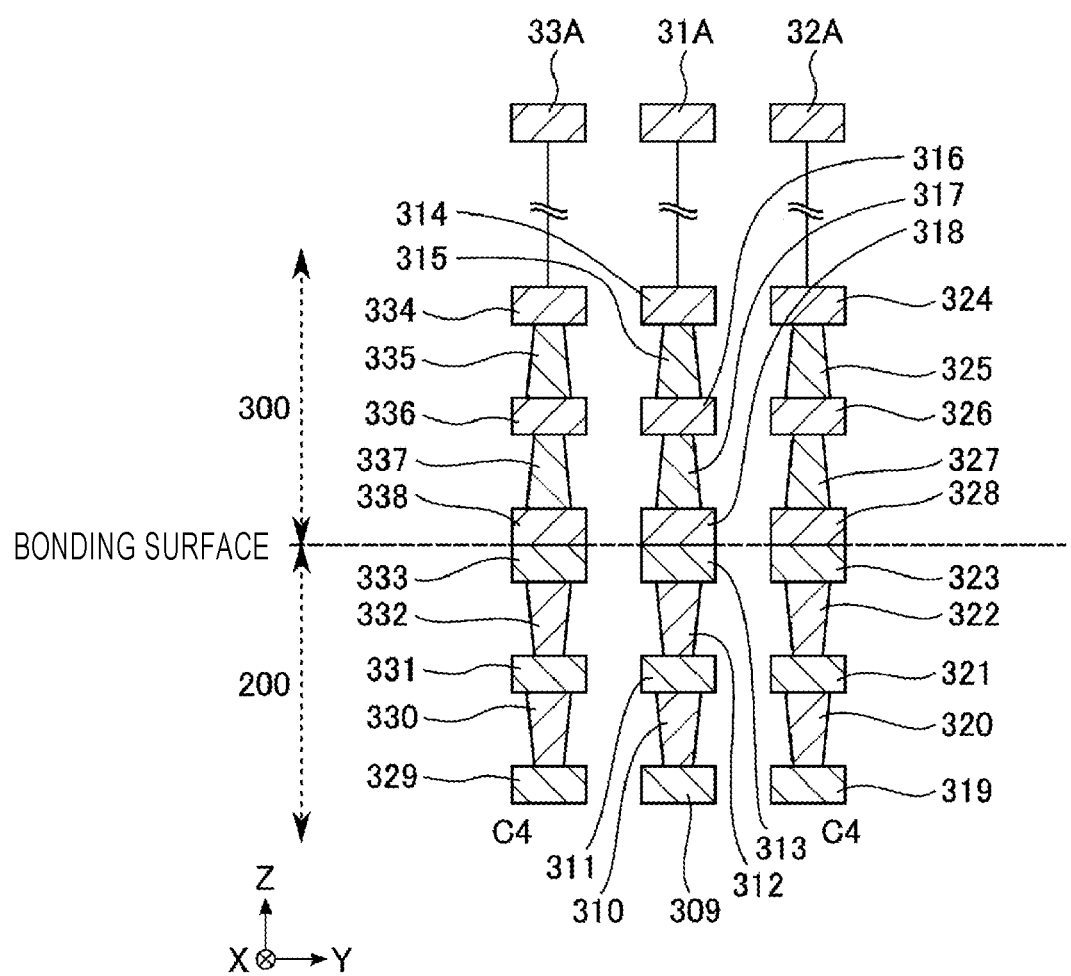
FIG. 21 is a cross-sectional view taken along the C4-C4 line in FIG. 17.

FIG. 18 is a cross-sectional view taken along the C1-C1 line in FIG. 17 (or the chain wiring), and FIG. 19 is a cross-sectional view taken along the C2-C2 line (or the adjacent wiring) in FIG. 17. FIGS. 20 and 21 are cross-sectional views taken along the C3-C3 line and the C4-C4 line in FIG. 17, respectively.

As illustrated in FIG. 17, the chain wiring 31_1 and the adjacent wirings 32_1 and 33_1 are provided in the end region 30. The chain wiring 31_1 and the adjacent wirings 32_1 and 33_1 are disposed adjacent to each other. The chain wiring 31_1 is disposed between the adjacent wirings 32_1 and 33_1.

As illustrated in FIGS. 17, 18 and 21, the chain wiring 31_1 includes the conductive pad 313, the via 312, the conductive layer 311, a via 310, and a conductive layer 309 in the peripheral circuit chip 200, and the conductive pad 318, the via 317, the conductive layer 316, the via 315, and the conductive layer 314 in the memory array chip 300.

As illustrated in FIG. 18, in the peripheral circuit chip 200, the conductive layer 309 extends in the X direction. The plurality of conductive pads 313 is arranged at predetermined intervals in the X direction. One conductive pad 313 is electrically connected to one end of the conductive layer 309 through the via 312, the conductive layer 311, and the via 310 in this order. Another conductive pad 313 is electrically connected to the other end of the conductive layer 309 through the via 312, the conductive layer 311, and the via 310 in this order.

In the memory array chip 300, the conductive layer 314 extends in the X direction. The plurality of conductive pads 318 is arranged at predetermined intervals in the X direction. One conductive pad 318 is electrically connected to one end of the conductive layer 314 through the via 317, the conductive layer 316, and the via 315 in this order. Another conductive pad 318 is electrically connected to the other end of the conductive layer 314 through the via 317, the conductive layer 316, and the via 315 in this order.

The conductive pad 31Ac is electrically connected to one conductive layer 314 through a via, a conductive layer, and a contact plug (not illustrated). The conductive pad 31Ad is electrically connected to another conductive layer 314 through a via, a conductive layer, and a contact plug (not illustrated).

Through such a structure, the conductive pad 31Ac and the conductive pad 31Ad are electrically connected to each other via the conductive layer 314, the via 315, the conductive layer 316, the via 317, the conductive pad 318, the conductive pad 313, the via 312, the conductive layer 311, the via 310, and the conductive layer 309.

As illustrated in FIGS. 17, 19, 20, and 21, the adjacent wiring 32_1 includes the conductive pad 323, the via 322, the conductive layer 321, a via 320, and a conductive layer 319 in the peripheral circuit chip 200, and the conductive pad 328, the via 327, the conductive layer 326, the via 325, and the conductive layer 324 in the memory array chip 300.

As illustrated in FIG. 19, in the peripheral circuit chip 200, the conductive layer 321 extends in the X direction. The plurality of conductive pads 323 and the plurality of vias 322 are arranged at predetermined intervals in the X direction. Each conductive pad 323 is electrically connected to the conductive layer 321 through the via 322. The conductive layer 319 extends in the X direction. The plurality of vias 320 is provided between the conductive layer 321 and the conductive layer 319. The vias 320 are arranged at predetermined intervals in the X direction. Each conductive pad 323 is electrically connected to the via 322, the conductive layer 321, the via 320, and the conductive layer 319.

In the memory array chip 300, the conductive layer 326 extends in the X direction. The plurality of conductive pads 328 and the plurality of vias 327 are arranged at predetermined intervals in the X direction. Each conductive pad 328 is electrically connected to the conductive layer 326 through the via 327. The conductive layer 324 extends in the X direction. The plurality of vias 325 is provided between the conductive layer 326 and the conductive layer 324. The vias 325 are arranged at predetermined intervals in the X direction. Each conductive pad 328 is electrically connected to the via 327, the conductive layer 326, the via 325, and the conductive layer 324.

The conductive pad 32Ab is electrically connected to the conductive layer 324 through a via, a conductive layer, and a contact plug (not illustrated).

Through such a structure, the conductive pad 32Ab is electrically connected to the conductive layer 324, the via 325, the conductive layer 326, the via 327, the conductive pad 328, the conductive pad 323, the via 322, the conductive layer 321, the via 320, and the conductive layer 319.

2.2 Operation of Second Embodiment

In the second embodiment, the chain wiring 31_1 is used to detect a bonding state (or an electrical connection state) at bonding locations between the conductive pads 313 of the peripheral circuit chip 200 and the conductive pads 318 of the memory array chip 300.

For example, an electrical resistance between the conductive pad 31Ac connected to one end of the chain wiring 31_1 and the conductive pad 31Ad connected to the other end of the chain wiring 31_1 is measured by using a probe device so that a bonding state between the conductive pads of the peripheral circuit chip 200 and the conductive pads of the memory array chip 300 can be determined.

In the second embodiment, misalignment at bonding locations between the peripheral circuit chip 200 and the memory array chip 300 is detected by using the chain wiring 31_1 and the adjacent wirings 32_1 and 33_1.

For example, an electrical resistance between the conductive pad 31Ac connected to the chain wiring 31_1 and the conductive pad 32Ab connected to the adjacent wiring 32_1, and between the conductive pad 31Ac, and the conductive pad 33Ab connected to the adjacent wiring 33_1 is measured by using a probe device, so as to detect whether an amount of misalignment at bonding locations between the peripheral circuit chip 200 and the memory array chip 300 falls within an allowable range. Others are the same as those in the above-described first embodiment.

2.3 Effect of Second Embodiment

According to the second embodiment, as in the above first embodiment, it is possible to easily detect a bonding failure (or a peeling failure), and a misalignment between conductive pads at bonding locations between the peripheral circuit chip 200 and the memory array chip 300. Accordingly, it is possible to reduce the number of defective semiconductor storage devices, and further to provide semiconductor storage devices capable of improving an operation reliability. Since it is possible to facilitate analysis on the bonding failure and the misalignment between the peripheral circuit chip 200 and the memory array chip 300, it is possible to improve the productivity of the semiconductor storage devices.

In the second embodiment, in the peripheral circuit chip 200, the conductive layer 309 is further provided closer to the semiconductor substrate 70 side than the conductive layer 311, and in the memory array chip 300, the conductive layer 314 is further provided closer to the semiconductor substrate 50 side than the conductive layer 316. These conductive layers 309 and 314 are used as conductive layers of the chain wiring 31_1 and also function as crack stoppers which prevent intrusion of cracks from the dicing line 101. Other effects are the same as those in the above first embodiment.

3. Third Embodiment

In a third embodiment, descriptions will be made on a chain wiring and adjacent wirings having a configuration different from that in the first and second embodiments. Configurations and operations not described below are the same as those in the first embodiment. In the third embodiment, differences from the first embodiment will be mainly described.

In the third embodiment, conductive pads for misalignment detection are disposed between the conductive pads 313, and between the conductive pads 318, while the conductive pads 313 and the conductive pads 318 are parts of the chain wiring. Accordingly, it is possible to detect misalignment not only in a direction perpendicular to the chain wiring (or the Y direction), but also along the extending direction of the chain wiring (or the X direction)

3.1 Details of End Region in Third Embodiment

Descriptions will be made on details of the chain wiring, and the adjacent wirings in the end region 30 in the third embodiment by using FIGS. 22 to 27.

Figure 22:
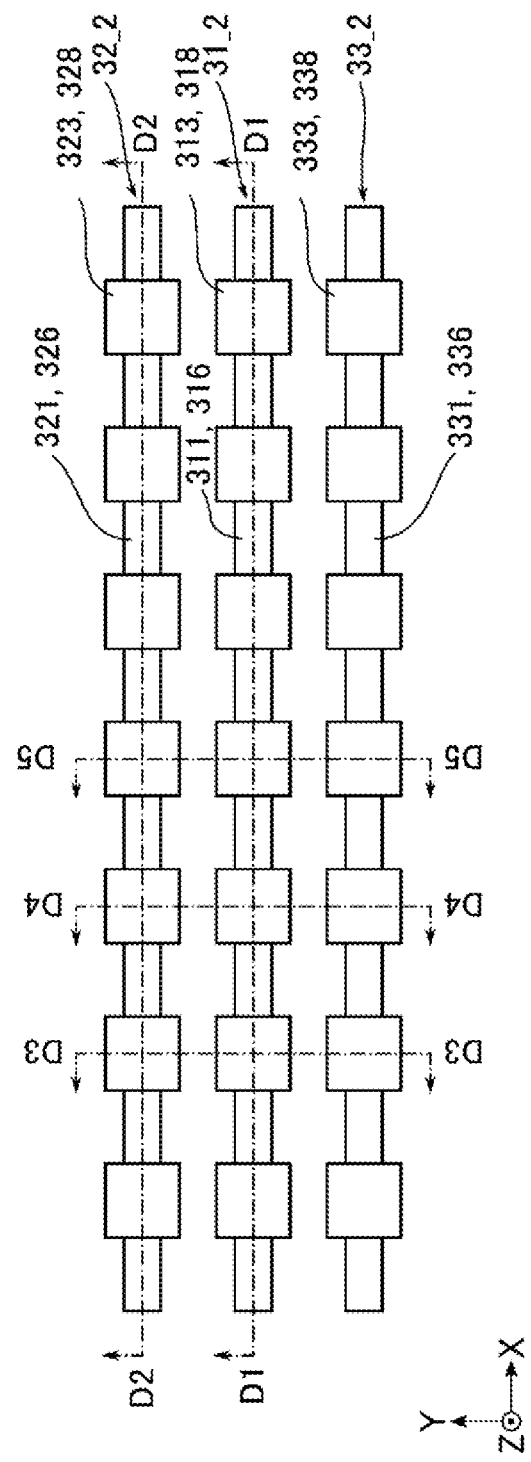
FIG. 22 is a plan view illustrating a chain wiring and adjacent wirings provided in the end region in a semiconductor storage device of a third embodiment.

FIG. 22 is a plan view schematically illustrating a chain wiring 31_2 and adjacent wirings 32_2 and 33_2 provided in the end region 30 in the third embodiment. FIG. 22 illustrates the chain wiring 31_2 and the adjacent wirings 32_2 and 33_2 along the top side TS. Along the left side LS, the right side RS, and the bottom side BS, the chain wiring 31_2 and the adjacent wirings 32_2 and 33_2 have the same structures as those illustrated in FIGS. 22 to 27 except that different conductive pads are employed for electrical resistance measurement.

Figure 23:
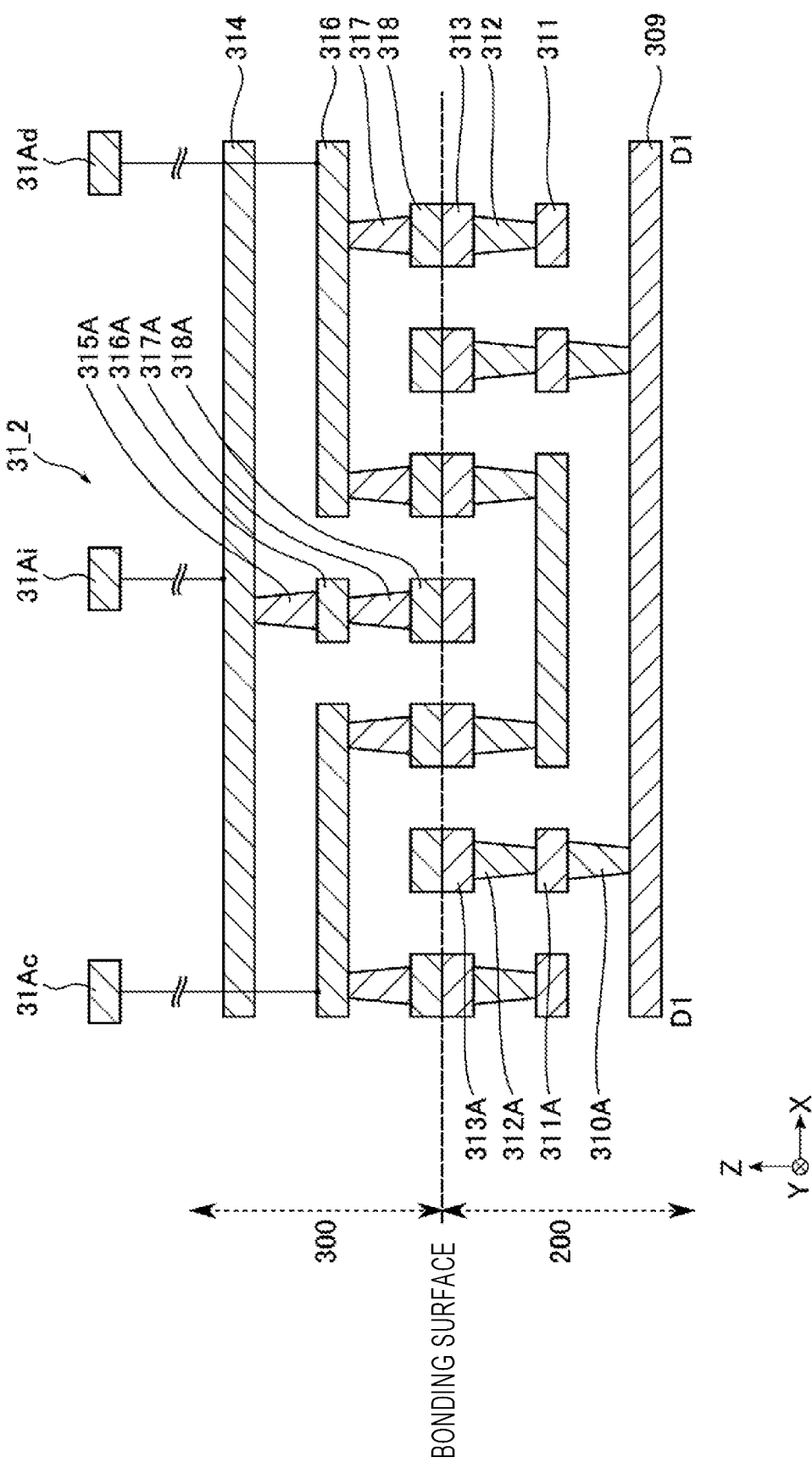
FIG. 23 is a cross-sectional view taken along the D1-D1 line in FIG. 22.
Figure 24:
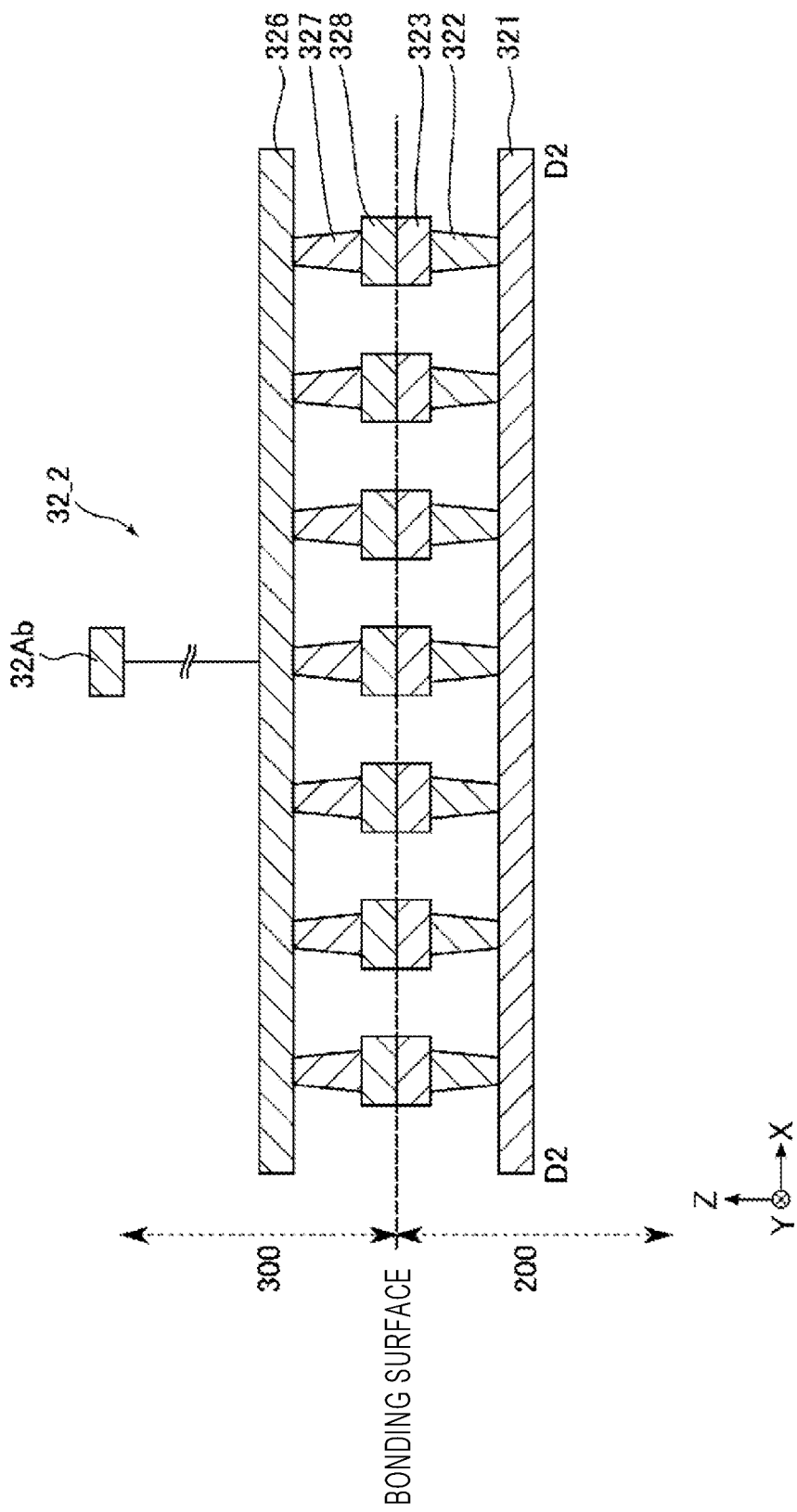
FIG. 24 is a cross-sectional view taken along the D2-D2 line in FIG. 22.
Figure 25:
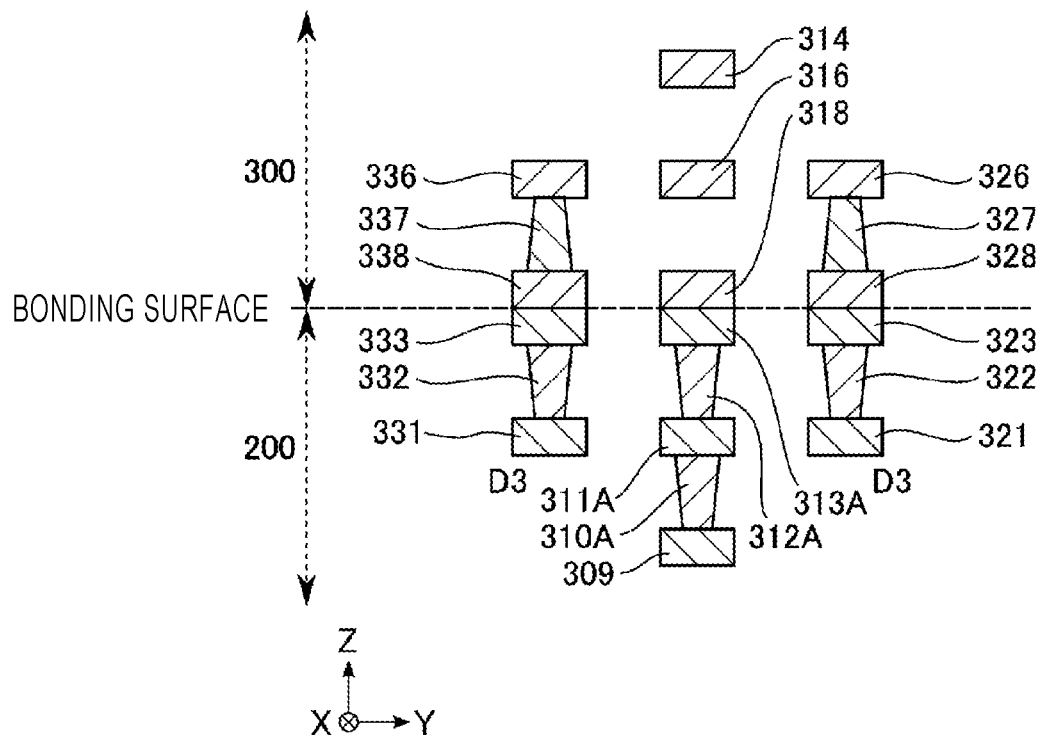
FIG. 25 is a cross-sectional view taken along the D3-D3 line in FIG. 22.
Figure 26:
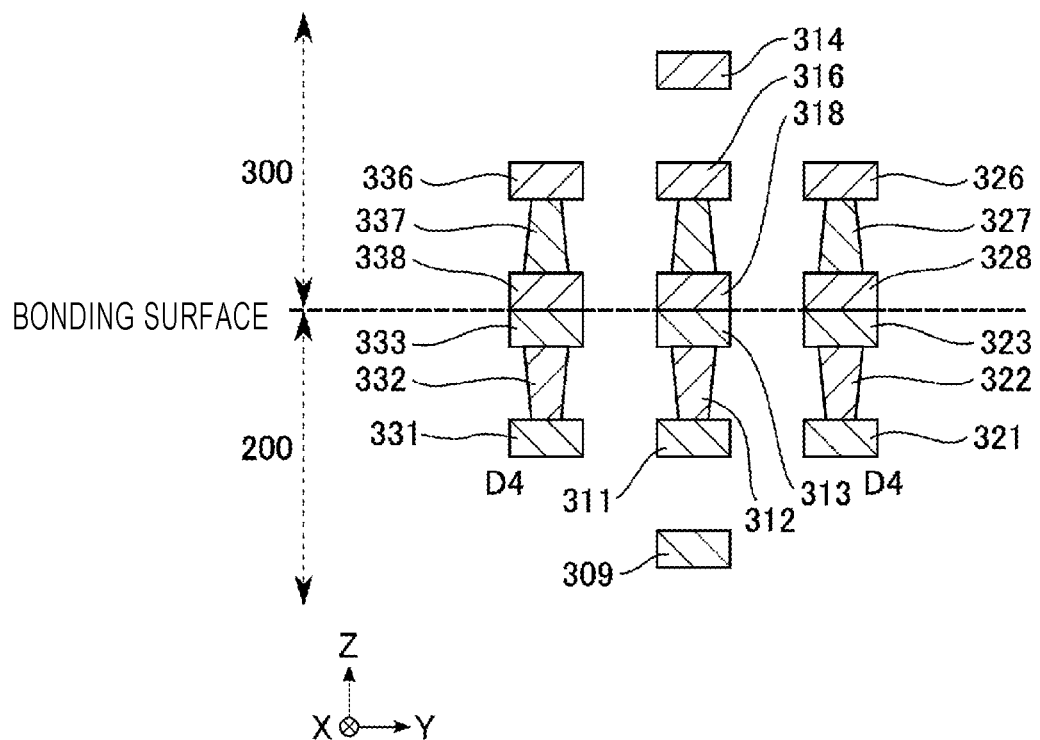
FIG. 26 is a cross-sectional view taken along the D4-D4 line in FIG. 22.
Figure 27:
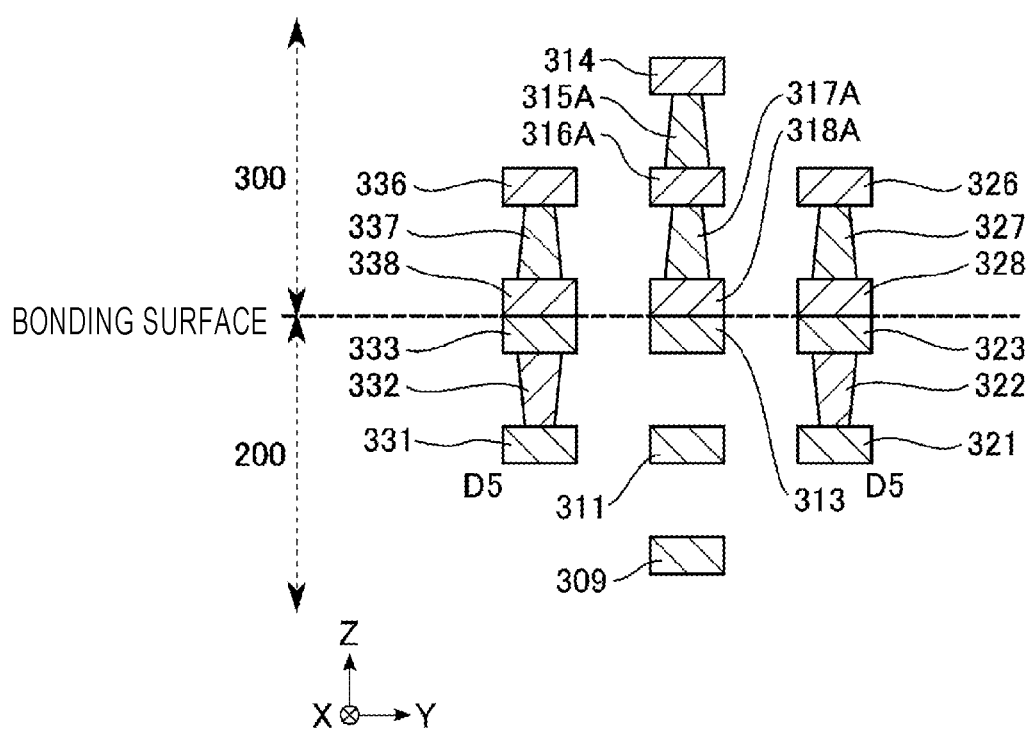
FIG. 27 is a cross-sectional view taken along the D5-D5 line in FIG. 22.

FIG. 23 is a cross-sectional view taken along the D1-D1 line (or the chain wiring) in FIG. 22, and FIG. 24 is a cross-sectional view taken along the D2-D2 line (or the adjacent wiring) in FIG. 22. FIGS. 25, 26 and 27 are cross-sectional views taken along the D3-D3 line, the D4-D4 line, and the D5-D5 line in FIG. 22, respectively.

As illustrated in FIG. 22, the chain wiring 31_2 and the adjacent wirings 32_2 and 33_2 are provided in the end region 30. The chain wiring 31_2 and the adjacent wirings 32_2 and 33_2 are disposed adjacent to each other. The chain wiring 31_2 is disposed between the adjacent wirings 32_2 and 33_2.

As illustrated in FIGS. 22, 23, 25, 26, and 27, the chain wiring 31_2 has the conductive pad 313, the via 312, the conductive layer 311, a conductive pad 313A, a via 312A, a conductive layer 311A, a via 310A, and the conductive layer 309 in the peripheral circuit chip 200, and the conductive pad 318, the via 317, the conductive layer 316, a conductive pad 318A, a via 317A, a conductive layer 316A, a via 315A, and the conductive layer 314 in the memory array chip 300.

As illustrated in FIG. 23, in the peripheral circuit chip 200, the conductive layer 311 extends in the X direction. The plurality of conductive pads 313 is arranged at predetermined intervals in the X direction. One conductive pad 313 is electrically connected to one end of the conductive layer 311 through the via 312. Another conductive pad 313 is electrically connected to the other end of the conductive layer 311 through the via 312. The conductive layer 309 extends in the X direction. The conductive pad 313A is disposed between one conductive pad 313 and another conductive pad 313. The conductive pad 313A is electrically connected to the conductive layer 309 through the via 312A, the conductive layer 311A, and the via 310A in this order.

In the memory array chip 300, the conductive layer 316 extends in the X direction. The plurality of conductive pads 318 is arranged at predetermined intervals in the X direction. One conductive pad 318 is electrically connected to one end of the conductive layer 316 through the via 317. Another conductive pad 318 is electrically connected to the other end of the conductive layer 316 through the via 317. The conductive layer 314 extends in the X direction. The conductive pad 318A is disposed between one conductive pad 318 and another conductive pad 318. The conductive pad 318A is electrically connected to the conductive layer 314 through the via 317A, the conductive layer 316A, and the via 315A in this order.

The conductive pads 313 and the conductive pads 318, and the conductive pads 313A and the conductive pads 318A are disposed at locations aligned with each other in the Z direction, respectively. The conductive pads 313 and the conductive pads 318 are bonded such that they face each other, and the conductive pads 313A and the conductive pads 318A are bonded such that they face each other.

The conductive pad 31Ac is electrically connected to one conductive layer 316 through a via, a conductive layer, and a contact plug (not illustrated). The conductive pad 31Ad is electrically connected to another conductive layer 316 through a via, a conductive layer, and a contact plug (not illustrated). A conductive pad 31Ai is electrically connected to the conductive layer 314 through a via, a conductive layer, and a contact plug (not illustrated).

As illustrated in FIG. 24, the adjacent wiring 32_2 has a narrower arrangement interval for the conductive pads 323 and 328 and the vias 322 and 327 than in the structure of the adjacent wiring 32 illustrated in FIG. 14 in the first embodiment. Other structures are the same as structures of the adjacent wiring 32. The adjacent wiring 33_2 has the same structure as the adjacent wiring 32_2, and thus descriptions thereof will be omitted.

3.2 Operation of Third Embodiment

In the third embodiment, the chain wiring 31_2 is used to detect a bonding state by evaluating the bonding between the conductive pads 313 of the peripheral circuit chip 200 and the conductive pads 318 of the memory array chip 300.

For example, an electrical resistance between the conductive pad 31Ac connected to one end of the chain wiring 31_2 and the conductive pad 31Ad connected to the other end of the chain wiring 31_2 is measured by using a probe device so that a bonding state between the conductive pads of the peripheral circuit chip 200 and the conductive pads of the memory array chip 300 can be determined.

In the third embodiment, misalignment at bonding locations between the peripheral circuit chip 200 and the memory array chip 300 is detected by using the chain wiring 31_2 and the adjacent wirings 32_2 and 33_2.

For example, an electrical resistance between the conductive pad 31Ac connected to the chain wiring 31_2 and the conductive pad 32Ab connected to the adjacent wiring 32_2, and between the conductive pad 31Ac and the conductive pad 33Ab connected to the adjacent wiring 33_2 is measured by using a probe device, so as to detect whether an amount of misalignment at bonding locations between the peripheral circuit chip 200 and the memory array chip 300 falls within an allowable range. Others are the same as those in the above described first embodiment.

3.3 Effect of Third Embodiment

According to the third embodiment, as in the above first embodiment, it is possible to easily detect a bonding failure (or a peeling failure), and a misalignment between conductive pads at bonding locations between the peripheral circuit chip 200 and the memory array chip 300. Accordingly, it is possible to reduce the number of defective semiconductor storage devices, and further to provide semiconductor storage devices capable of improving an operation reliability. Since it is possible to facilitate analysis on the bonding failure and the misalignment between the peripheral circuit chip 200 and the memory array chip 300, it is possible to improve the productivity of the semiconductor storage devices.

In the third embodiment, the conductive pad 318A is disposed between the conductive pads 313 of the chain wiring 31_2 so that misalignment in a direction (the X direction) along extending direction of the chain wiring 31_2 may also be detected.

As in the second embodiment, in the peripheral circuit chip 200, the conductive layer 309 is further provided closer to the semiconductor substrate 70 side than the conductive layer 311, and in the memory array chip 300, the conductive layer 314 is further provided closer to the semiconductor substrate 50 side than the conductive layer 316. These conductive layers 309 and 314 are used as conductive layers of the chain wiring 31_2, and also function as crack stoppers which prevent intrusion of cracks from the dicing line 101. Other effects are the same as those in the above first embodiment.

4. Fourth Embodiment

In the fourth embodiment, descriptions will be made on a chain wiring and adjacent wirings having a configuration different from that in the first to third embodiments. Configurations and operations not described below are the same as those in the first embodiment. In the fourth embodiment, differences from the first embodiment will be mainly described.

In the fourth embodiment, as in the third embodiment, conductive pads for misalignment detection are disposed between the conductive pads 313 and between the conductive pads 318 while the conductive pads 313 and the conductive pads 318 are parts of the chain wiring. Further, the adjacent wiring 32_3 and the adjacent wiring 33_3 are electrically connected. Accordingly, it is possible to detect misalignment not only in a direction perpendicular to the chain wiring, but also along an extending direction of the chain wiring.

4.1 Details of End Region in Fourth Embodiment

Descriptions will be made on details of the chain wiring, and the adjacent wirings in the end region 30 in the fourth embodiment by using FIGS. 28 to 33.

Figure 28:
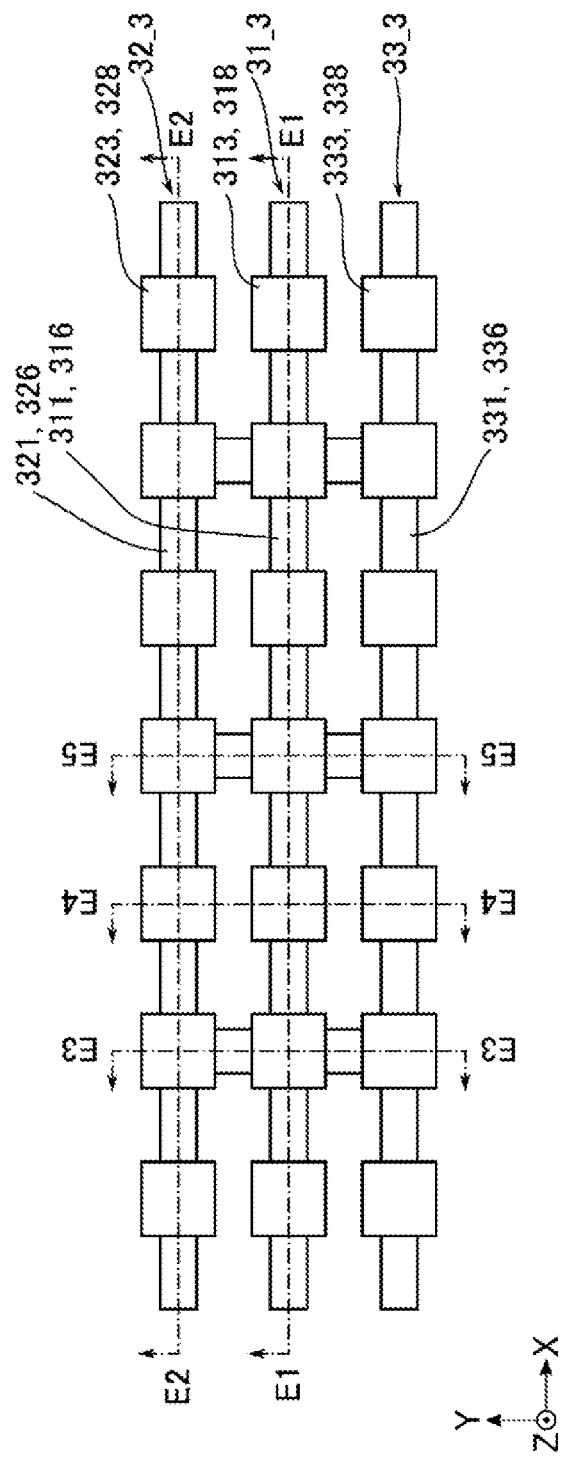
FIG. 28 is a plan view illustrating a chain wiring and adjacent wirings provided in the end region in a semiconductor storage device of a fourth embodiment.

FIG. 28 is a plan view schematically illustrating a chain wiring 31_3 and adjacent wirings 32_3 and 33_3 provided in the end region 30 in the fourth embodiment. FIG. 28 illustrates the chain wiring 31_3 and the adjacent wirings 32_3 and 33_3 along the top side TS. Along the left side LS, the right side RS, and the bottom side BS, the chain wiring 31_3 and the adjacent wirings 32_3 and 33_3 have the same structures as those illustrated in FIGS. 28 to 33 except that different conductive pads are employed for electrical resistance measurement.

Figure 29:
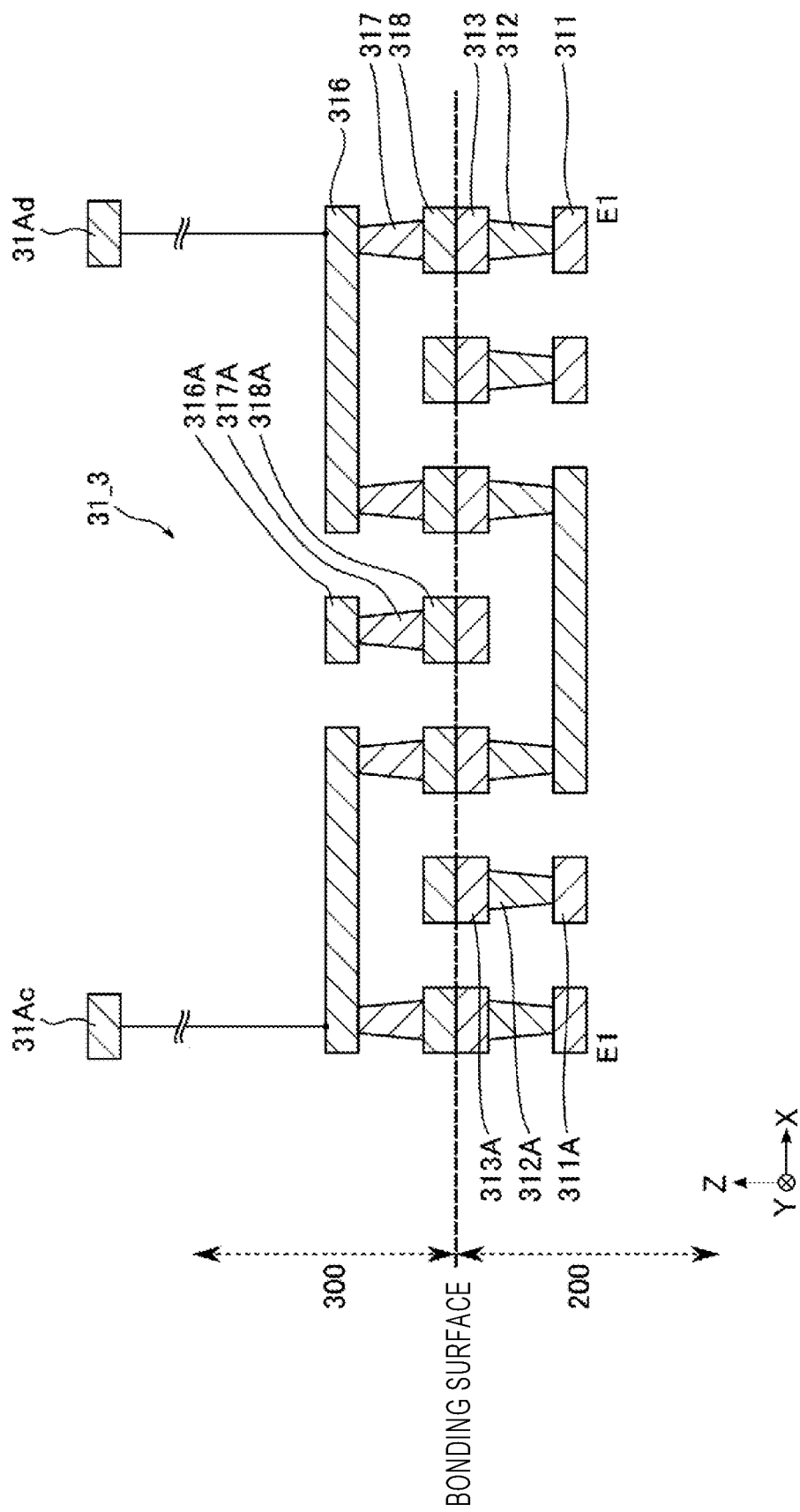
FIG. 29 is a cross-sectional view taken along the E1-E1 line in FIG. 28.
Figure 30:
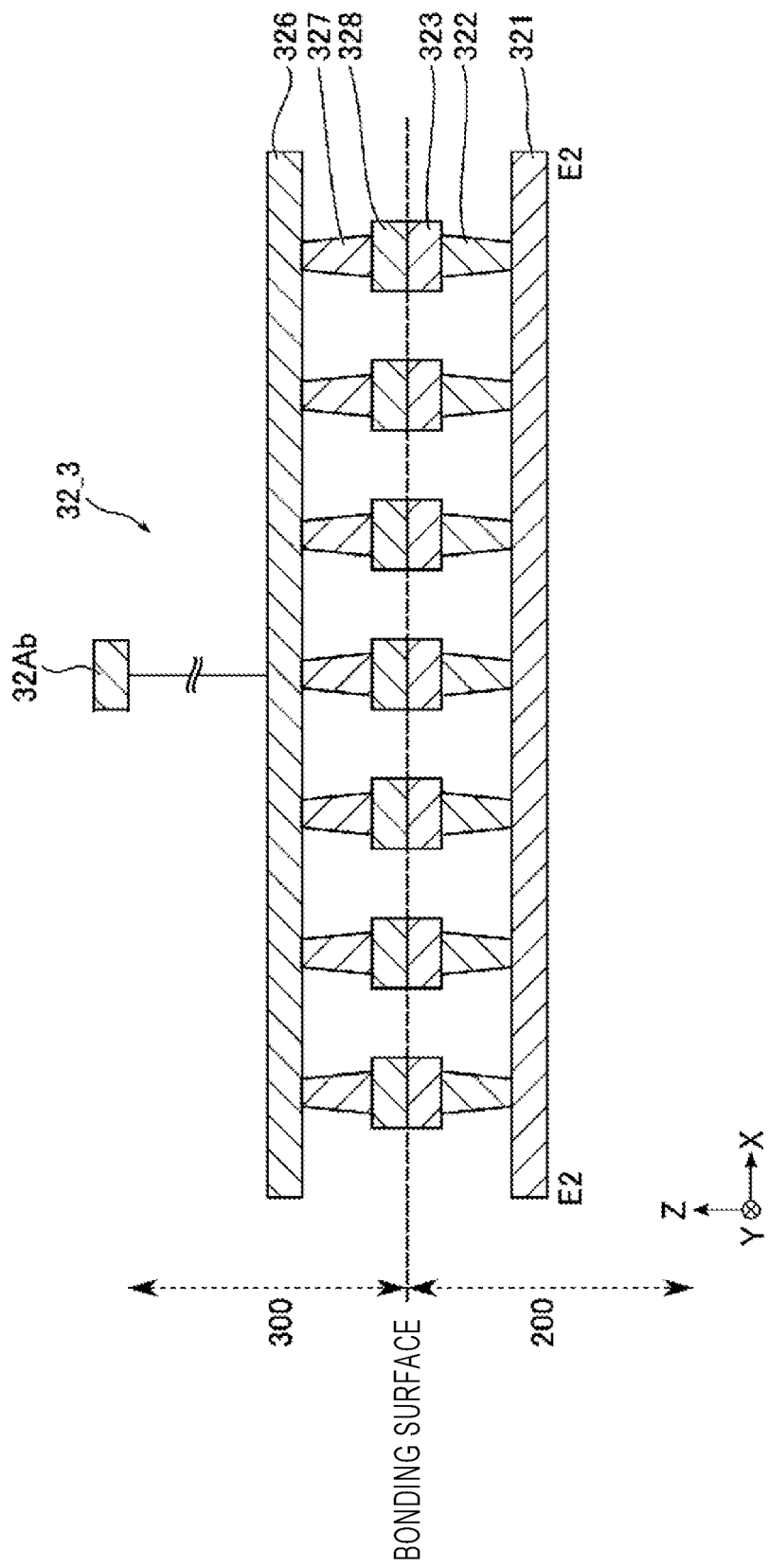
FIG. 30 is a cross-sectional view taken along the E2-E2 line in FIG. 28.
Figure 31:
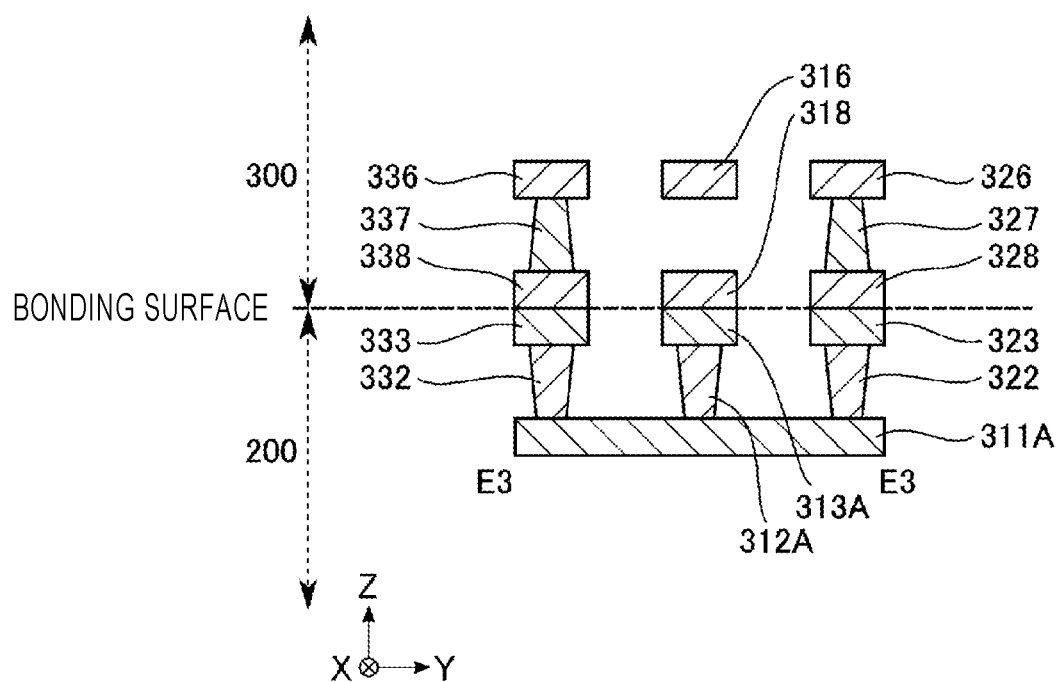
FIG. 31 is a cross-sectional view taken along the E3-E3 line in FIG. 28.
Figure 32:
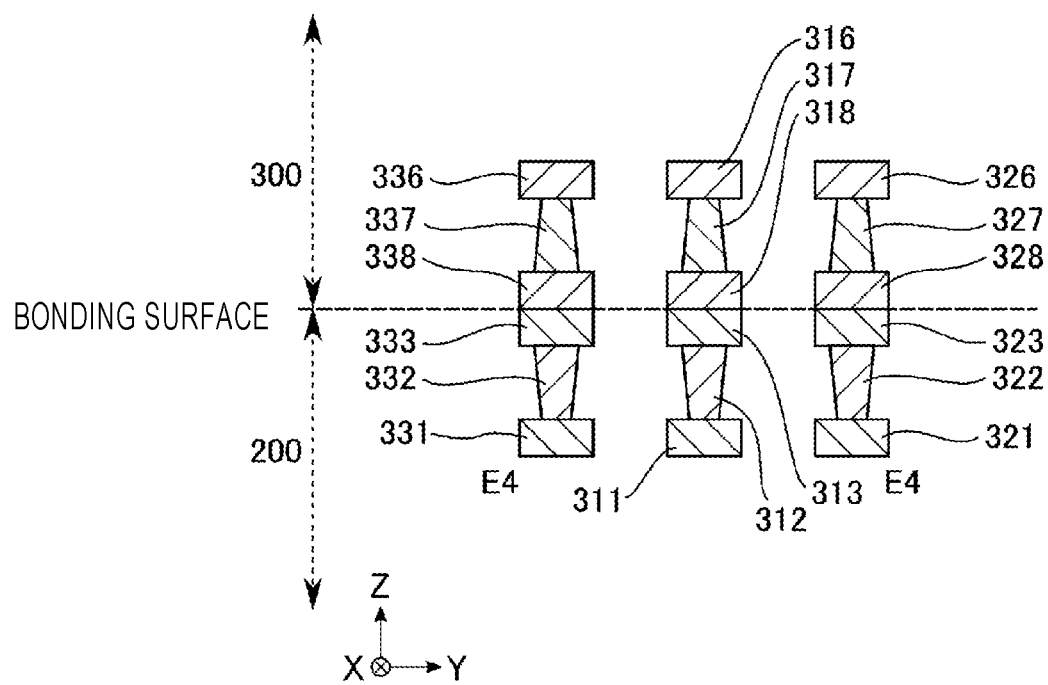
FIG. 32 is a cross-sectional view taken along the E4-E4 line in FIG. 28.
Figure 33:
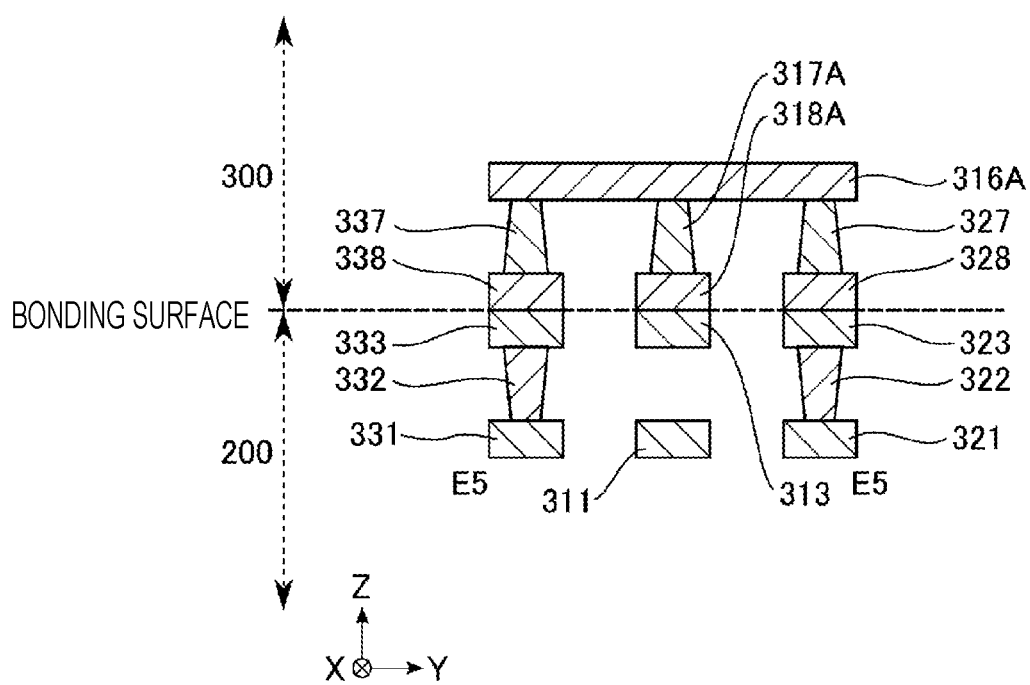
FIG. 33 is a cross-sectional view taken along the E5-E5 line in FIG. 28.

FIG. 29 is a cross-sectional view taken along the E1-E1 line (or the chain wiring) in FIG. 28, and FIG. 30 is a cross-sectional view taken along the E2-E2 line (or the adjacent wiring) in FIG. 28. FIGS. 31, 32, and 33 are cross-sectional views taken along the E3-E3 line, the E4-E4 line, and the E5-E5 line in FIG. 28, respectively.

As illustrated in FIG. 28, the chain wiring 31_3 and the adjacent wirings 32_3 and 33_3 are provided in the end region 30. The chain wiring 31_3 and the adjacent wirings 32_3 and 33_3 are disposed adjacent to each other. The chain wiring 31_3 is disposed between the adjacent wirings 32_3 and 33_3.

As illustrated in FIGS. 28, 29, 31, 32, and 33, the chain wiring 31_3 has the conductive pad 313, the via 312, the conductive layer 311, the conductive pad 313A, the via 312A, and the conductive layer 311A in the peripheral circuit chip 200, and the conductive pad 318, the via 317, the conductive layer 316, the conductive pad 318A, the via 317A, and the conductive layer 316A in the memory array chip 300.

As illustrated in FIG. 29, in the peripheral circuit chip 200, the conductive layer 311 extends in the X direction. The plurality of conductive pads 313 is arranged at predetermined intervals in the X direction. One conductive pad 313 is electrically connected to one end of the conductive layer 311 through the via 312. Another conductive pad 313 is electrically connected to the other end of the conductive layer 311 through the via 312. The conductive pad 313A is disposed between one conductive pad 313 and another conductive pad 313. The conductive pad 313A is electrically connected to the conductive layer 311A through the via 312A.

In the memory array chip 300, the conductive layer 316 extends in the X direction. The plurality of conductive pads 318 is arranged at predetermined intervals in the X direction. One conductive pad 318 is electrically connected to one end of the conductive layer 316 through the via 317. Another conductive pad 318 is electrically connected to the other end of the conductive layer 316 through the via 317. The conductive pad 318A is disposed between one conductive pad 318 and another conductive pad 318. The conductive pad 318A is electrically connected to the conductive layer 314 through the via 317A.

The conductive pads 313 and the conductive pads 318 are bonded such that they face each other, and the conductive pads 313A and the conductive pads 318A are bonded such that they face each other.

The conductive pad 31Ac is electrically connected to one conductive layer 316 through a via, a conductive layer, and a contact plug (not illustrated). The conductive pad 31Ad is electrically connected to another conductive layer 316 through a via, a conductive layer, and a contact plug (not illustrated).

As illustrated in FIG. 30, the adjacent wiring 32_3 has a narrower arrangement interval for the conductive pads 323 and 328 than in the structure of the adjacent wiring 32 in the first embodiment illustrated in FIG. 14, as in the third embodiment. Other structures are the same as those in the first embodiment. The adjacent wiring 33_3 has the same structure as the adjacent wiring 32_3, and thus descriptions thereof will be omitted.

4.2 Operation of Fourth Embodiment

In the fourth embodiment, the chain wiring 31_3 is used to detect a bonding state by evaluating the bonding between the conductive pads 313 of the peripheral circuit chip 200 and the conductive pads 318 of the memory array chip 300.

For example, an electrical resistance between the conductive pad 31Ac connected to one end of the chain wiring 31_3 and the conductive pad 31Ad connected to the other end of the chain wiring 31_3 is measured by using a probe device so that a bonding state between the conductive pads of the peripheral circuit chip 200 and the conductive pads of the memory array chip 300 can be determined.

In the fourth embodiment, misalignment at bonding locations between the peripheral circuit chip 200 and the memory array chip 300 is detected by using the chain wiring 31_3 and the adjacent wirings 32_3 and 33_3.

For example, an electrical resistance between the conductive pad 31Ac connected to the chain wiring 31_3 and the conductive pad 32Ab connected to the adjacent wiring 32_3, and between the conductive pad 31Ac and the conductive pad 33Ab connected to the adjacent wiring 33_3 is measured by using a probe device, so as to detect whether an amount of misalignment at bonding locations between the peripheral circuit chip 200 and the memory array chip 300 falls within an allowable range. Others are the same as those in the above described first embodiment.

4.3 Effect of Fourth Embodiment

According to the fourth embodiment, as in the above first embodiment, it is possible to easily detect a bonding failure (or a peeling failure), and a misalignment between conductive pads at bonding locations between the peripheral circuit chip 200 and the memory array chip 300. Accordingly, it is possible to reduce the number of defective semiconductor storage devices, and further to provide semiconductor storage devices capable of improving an operation reliability. Since it is possible to facilitate analysis on the bonding failure and the misalignment between the peripheral circuit chip 200 and the memory array chip 300, it is possible to improve the productivity of the semiconductor storage devices.

In the fourth embodiment, the conductive pad 318A is disposed between the conductive pads 313 of the chain wiring 31_3 so that misalignment in a direction (the X direction) along the chain wiring 31_3 may also be detected. Other effects are the same as those in the above first embodiment.

5. Other Modifications, Etc.

In the above embodiments, although a NAND-type flash memory as the semiconductor storage device is described as an example, the present disclosure is not limited to the NAND-type flash memory, and may also be applicable to other semiconductor memories in general, and further to various storage devices other than semiconductor memories.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. For example, in the above-descried embodiments, the conductive pads 31A, 32A, and 33A connected with the respective wiring 31, 32, and 33 are provided on the exterior surface of the semiconductor substrate 50 of the memory array chip 300. However, the conductive pads 31A, 32A, and 33A may be provided on the exterior surface of the semiconductor substrate 70 of the peripheral circuit chip 200. Further, each of the conductive pads 31A, 32A, and 33A may be provided on both the exterior surfaces of the semiconductor substrates 50 and 70, such that voltages can be supplied form or monitored at the arbitrary direction depending on the examination environment etc. The accompanying claims and their equivalents are intended to cover such forms or modifications as would fall within the scope and spirit of the inventions.

What is claimed is:

1. A semiconductor storage device comprising:
   a first chip including
      a plurality of memory cells provided on a first substrate in a memory cell region,
      a plurality of first pads provided on a first surface of the first substrate and disposed in an edge region of the first chip that surrounds the memory cell region, wherein the edge region of the first chip includes first, second, third, and fourth sides that surround the memory cell region and at least four of the first pads are arranged along a first direction on the first side of the edge region of the first chip, and wherein inside the first chip:
         a first one of the first pads is not electrically connected to a second one of the first pads and a third one of the first pads is not electrically connected to a fourth one of the first pads; and the second one of the first pads is electrically connected to the third one of the first pads, and a first conductive layer provided on the first substrate and electrically connected to the first pads; and a second chip including a first circuit provided on a second substrate in a circuit region, a plurality of second pads provided on the second substrate and disposed in an edge region of the second chip that surrounds the circuit region, wherein the edge region of the second chip includes first, second, third, and fourth sides that surround the circuit region and at least four of the second pads are arranged along the first direction on the first side of the edge region of the second chip, and wherein inside the second chip:

a first one of the second pads is electrically connected to a second one of the second pads and a third one of the second pads is electrically connected to a fourth one of the second pads; and the second one of the second pads is not electrically connected to the third one of the second pads, and a second conductive layer provided on the second substrate and electrically connected to the second pads, wherein the first, second, third, and fourth ones of the first pads of the first chip and the first, second, third, and fourth ones of the second pads of the second chip are respectively bonded facing each other.

2. The semiconductor storage device according to claim 1, wherein the first pads, the first conductive layer, the second pads, and the second conductive layer are electrically insulated from the memory cells and the first circuit.

3. The semiconductor storage device according to claim 1, wherein the first chip further includes a plurality of third pads provided on a second surface of the first substrate that is opposite to the first surface, and the third pads are electrically connected to the first pads.

4. The semiconductor storage device according to claim 3, wherein two of the third pads are electrically connected through the first pads, the first conductive layer, the second pads, and the second conductive layer.

5. The semiconductor storage device according to claim 4, wherein an electrical resistance of a conductive path between said two of the third pads indicates a quality of the bonding between the first and second pads.

6. The semiconductor storage device according to claim 1, wherein the first chip further includes a plurality of third pads on the first surface of the first substrate and surrounding the first pads, and a third conductive layer provided on the first substrate and electrically connected to the third pads, and the second chip further includes a plurality of fourth pads on the second substrate and surrounding the second pads, and a fourth conductive layer provided on the second substrate and electrically connected to the fourth pads, wherein the third pads of the first chip and the fourth pads of the second chip are bonded facing each other.

7. The semiconductor storage device according to claim 6, wherein the first chip further includes a plurality of fifth pads on the first surface of the first substrate and surrounded by the first pads, and a fifth conductive layer provided on the first substrate and electrically connected to the fifth pads, and the second chip further includes a plurality of sixth pads on the second substrate and surrounded by the second pads, and a sixth conductive layer provided on the second substrate and electrically connected to the sixth pads, wherein the fifth pads of the first chip and the sixth pads of the second chip are bonded facing each other.

8. The semiconductor storage device according to claim 7, wherein the first chip further includes a plurality of seventh, eighth, and ninth pads provided on a second surface of the first substrate that is opposite to the first surface, and the seventh, eighth, and ninth pads are electrically connected to the first, third, and fifth pads, respectively.

9. The semiconductor storage device according to claim 8, wherein the seventh pads are electrically isolated from the eighth pads and the ninth pads, and the eighth pads are electrically isolated from the ninth pads.

10. The semiconductor storage device according to claim 9, wherein a length of the first, third, and fifth pads in a first direction is greater than an interval between the first and third pads in the first direction and an interval between the third and fifth pads in the first direction.

11. A method of forming a semiconductor storage device from a first chip and a second chip, the first chip including a plurality of memory cells provided on a first substrate in a memory cell region, a plurality of first pads provided on a first surface of the first substrate and disposed in an edge region of the first chip that surrounds the memory cell region, wherein the edge region of the first chip includes first, second, third, and fourth sides that surround the memory cell region and at least four of the first pads are arranged along a first direction on the first side of the edge region of the first chip, and wherein inside the first chip:

a first one of the first pads is not electrically connected to a second one of the first pads and a third one of the first pads is not electrically connected to a fourth one of the first pads; and the second one of the first pads is electrically connected to the third one of the first pads, and a first conductive layer provided on the first substrate and electrically connected to the first pads, and the second chip including a first circuit provided on a second substrate in a circuit region, a plurality of second pads provided on the second substrate and disposed in an edge region of the second chip that surrounds the circuit region, wherein the edge region of the second chip includes first, second, third, and fourth sides that surround the circuit region and at least four of the second pads are arranged along the first direction on the first side of the edge region of the second chip, and wherein inside the second chip:

a first one of the second pads is electrically connected to a second one of the second pads and a third one of the second pads is electrically connected to a fourth one of the second pads; and the second one of the second pads is not electrically connected to the third one of the second pads, and a second conductive layer provided on the second substrate and electrically connected to the second pads, wherein said method includes:

positioning the first and second chips so that the first, second, third, and fourth ones of the first pads of the first chip and the first, second, third, and fourth ones of the second pads of the second chip are respectively facing each other; and bonding the first, second, third, and fourth ones of the first pads and the first, second, third, and fourth ones of the second pads that are respectively facing each other.

12. The method according to claim 11, wherein the first pads, the first conductive layer, the second pads, and the second conductive layer are electrically insulated from the memory cells and the first circuit.

13. The method according to claim 11, wherein the first chip further includes a plurality of third pads provided on a second surface of the first substrate that is opposite to the first surface, and the third pads are electrically connected to the first pads.

14. The method according to claim 13, wherein two of the third pads are electrically connected through the first pads, the first conductive layer, the second pads, and the second conductive layer.

15. The method according to claim 14, further comprising:

measuring an electrical resistance of a conductive path between said two of the third pads to determine a quality of the bonding between the first and second pads.

16. The method according to claim 11, wherein the first chip further includes a plurality of third pads on the first surface of the first substrate and surrounding the first pads, and a third conductive layer provided on the first substrate and electrically connected to the third pads, and the second chip further includes a plurality of fourth pads on the second substrate and surrounding the second pads, and a fourth conductive layer provided on the second substrate and electrically connected to the fourth pads, wherein the third pads of the first chip and the fourth pads of the second chip are bonded facing each other.

17. The method according to claim 16, wherein the first chip further includes a plurality of fifth pads on the first surface of the first substrate and surrounded by the first pads, and a fifth conductive layer provided on the first substrate and electrically connected to the fifth pads, and the second chip further includes a plurality of sixth pads on the second substrate and surrounded by the second pads, and a sixth conductive layer provided on the second substrate and electrically connected to the sixth pads, wherein the fifth pads of the first chip and the sixth pads of the second chip are bonded facing each other.

18. The method according to claim 17, wherein the first chip further includes a plurality of seventh, eighth, and ninth pads provided on a second surface of the first substrate that is opposite to the first surface, and the seventh, eighth, and ninth pads are electrically connected to the first, third, and fifth pads, respectively.

19. The method according to claim 18, further comprising:

determining whether or not the seventh pads are electrically isolated from the eighth pads and whether or not the seventh pads are electrically isolated from the ninth pads; and detecting a misalignment according to said determining.

20. The method according to claim 19, wherein said determining is carried out by measuring an electrical resistance between one of the seventh pads and one of the eighth and ninth pads.

* * * * *